US012784832B2

(12) United States Patent
Choi et al.

(10) Patent No.: US 12,784,832 B2
(45) Date of Patent: Nov. 3, 2026

(54) MEMORY ARRAY STRUCTURES

(71) Applicant: MICRON TECHNOLOGY, INC., Boise, ID (US)

(72) Inventors: Jae Kyu Choi, Boise, ID (US); Jin Yue, Boise, ID (US); Kyubong Jung, Boise, ID (US); Albert Fayrushin, Boise, ID (US); Jae Young Ahn, Boise, ID (US); Jun Kyu Yang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 437 days.

(21) Appl. No.: 18/234,046

(22) Filed: Aug. 15, 2023

(65) Prior Publication Data

US 2024/0071500 A1 Feb. 29, 2024

Related U.S. Application Data

(60) Provisional application No. 63/402,100, filed on Aug. 30, 2022.

(51) Int. Cl.

| | |
|---|---|
| ***G11C 16/04*** | (2006.01) |
| ***H10B 41/10*** | (2023.01) |
| ***H10B 41/27*** | (2023.01) |
| ***H10B 41/35*** | (2023.01) |
| ***H10B 43/10*** | (2023.01) |
| ***H10B 43/27*** | (2023.01) |
| ***H10B 43/35*** | (2023.01) |

(52) U.S. Cl.

CPC ......... *G11C 16/0483* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)

(58) Field of Classification Search

CPC ........ H10B 41/10; H10B 41/27; H10B 41/35; H10B 43/10; H10B 43/27; H10B 43/35; G11C 16/0483

See application file for complete search history.

(56) References Cited

U.S. PATENT DOCUMENTS

2016/0013201 A1* 1/2016 Higuchi ................. H10B 41/35 257/314
2021/0343736 A1* 11/2021 Surthi .................... G11C 5/025

* cited by examiner

*Primary Examiner* — Meiya Li
(74) *Attorney, Agent, or Firm* — Dicke, Billig & Czaja, PLLC

(57) ABSTRACT

Memory array structures, and methods of their formation; might include a first memory cell having a first control gate and an adjacent first portion of a charge-blocking structure, a second memory cell having a second control gate and an adjacent second portion of the charge-blocking structure, and a first dielectric material between the first control gate and the second control gate, and adjacent to a third portion of the charge-blocking structure that is between the first and second portions of the charge-blocking structure. The third portion of the charge-blocking structure might include a second dielectric material and a third dielectric material different than the second dielectric material, and the first portion of the charge-blocking structure and the second portion of the charge-blocking structure might each include the third dielectric material and a fourth dielectric material different than the second dielectric material.

20 Claims, 20 Drawing Sheets

MEMORY ARRAY STRUCTURES

RELATED APPLICATION

This application claims the benefit of U.S. Provisional Application No. 63/402,100, filed on Aug. 30, 2022, hereby incorporated herein in its entirety by reference.

TECHNICAL FIELD

The present disclosure relates generally to integrated circuits, and, in particular, in one or more embodiments, the present disclosure relates to memory array structures and methods of their fabrication, as well as apparatus containing such memory array structures.

BACKGROUND

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

A general trend in semiconductor memory fabrication is to increase memory density. This might be accomplished by decreasing feature sizes and/or utilizing three-dimensional array structures to increase the number of memory cells formed in a given area of a semiconductor wafer. However, such approaches have limitations.

DETAILED DESCRIPTION

Figure 1:
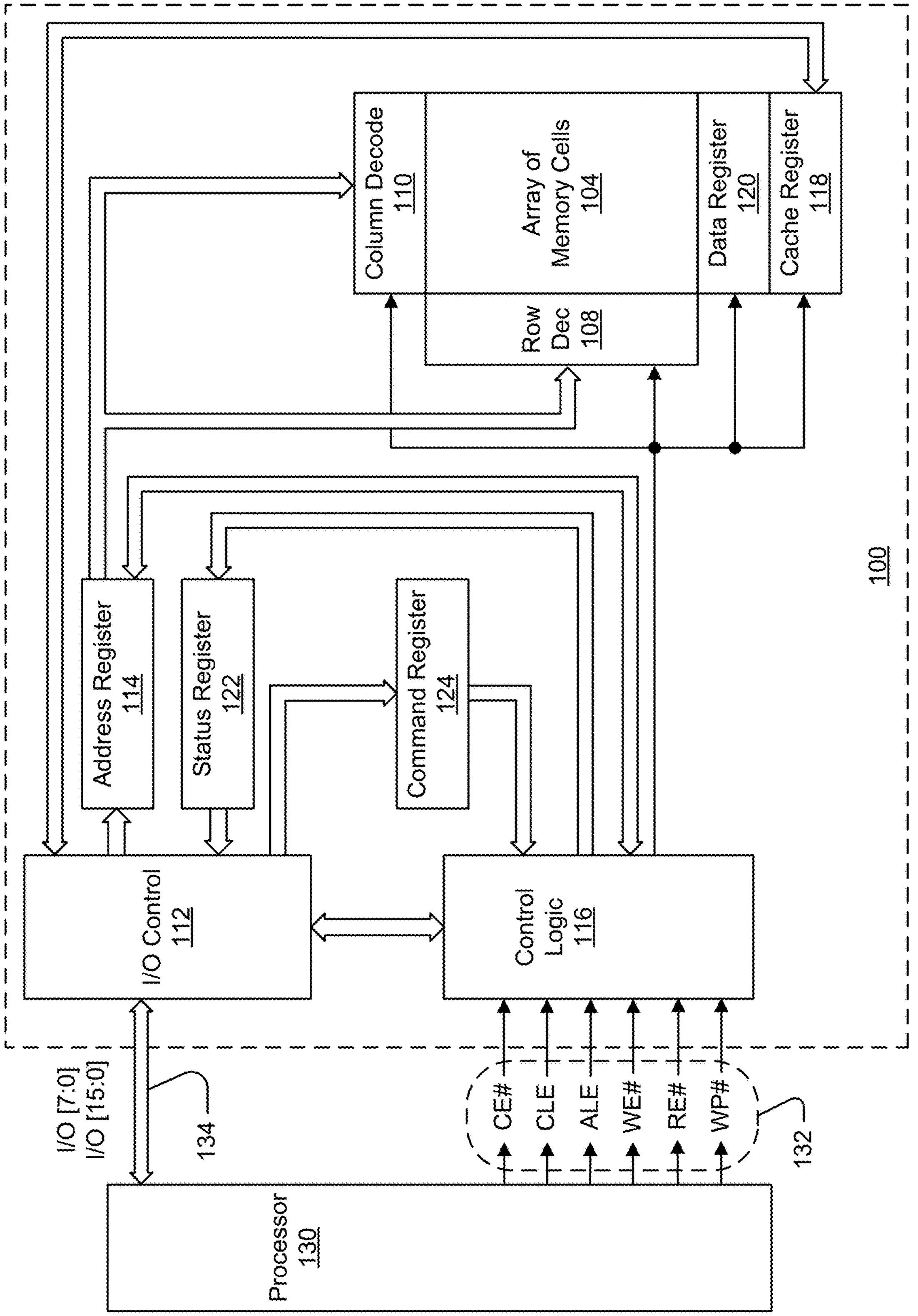
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting by an electrically conductive path unless otherwise apparent from the context.

As used herein, multiple acts being performed concurrently will mean that each of these acts is performed for a respective time period, and each of these respective time periods overlaps, in part or in whole, with each of the remaining respective time periods. In other words, portions of each of those acts are simultaneously performed for at least some period of time.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and might generate status information for the external processor 130, i.e., control logic 116 is configured to perform array operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104, then new data might be latched in the cache register 118 from the I/O control circuitry 112. During a read operation, data might be passed from the cache register 118 to the I/O control circuitry 112 for output to the external processor 130, then new data might be passed from the data register 120 to the cache register 118. The cache register 118 and/or the data register 120 might form (e.g., might form a portion of) a page buffer of the memory device 100. A data register 120 might further include sense circuits (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

The control logic 116 might further be in communication with temperature sensor 126. Temperature sensor 126 might sense a temperature of the memory device 100 and provide an indication to the control logic 116 representative of that temperature, such as some voltage, resistance level, digital representation, etc. Some examples of a temperature sensor 126 might include a thermocouple, a resistive device, a thermistor or an infrared sensor. Alternatively, temperature sensor 126 might be external to memory device 100 and in communication with the external processor 130. In this configuration, temperature sensor 126 might provide an indication of ambient temperature rather than device temperature. Processor 130 could communicate the indication representative of the temperature to the control logic 116, such as across input/output (I/O) bus 134 as a digital representation.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
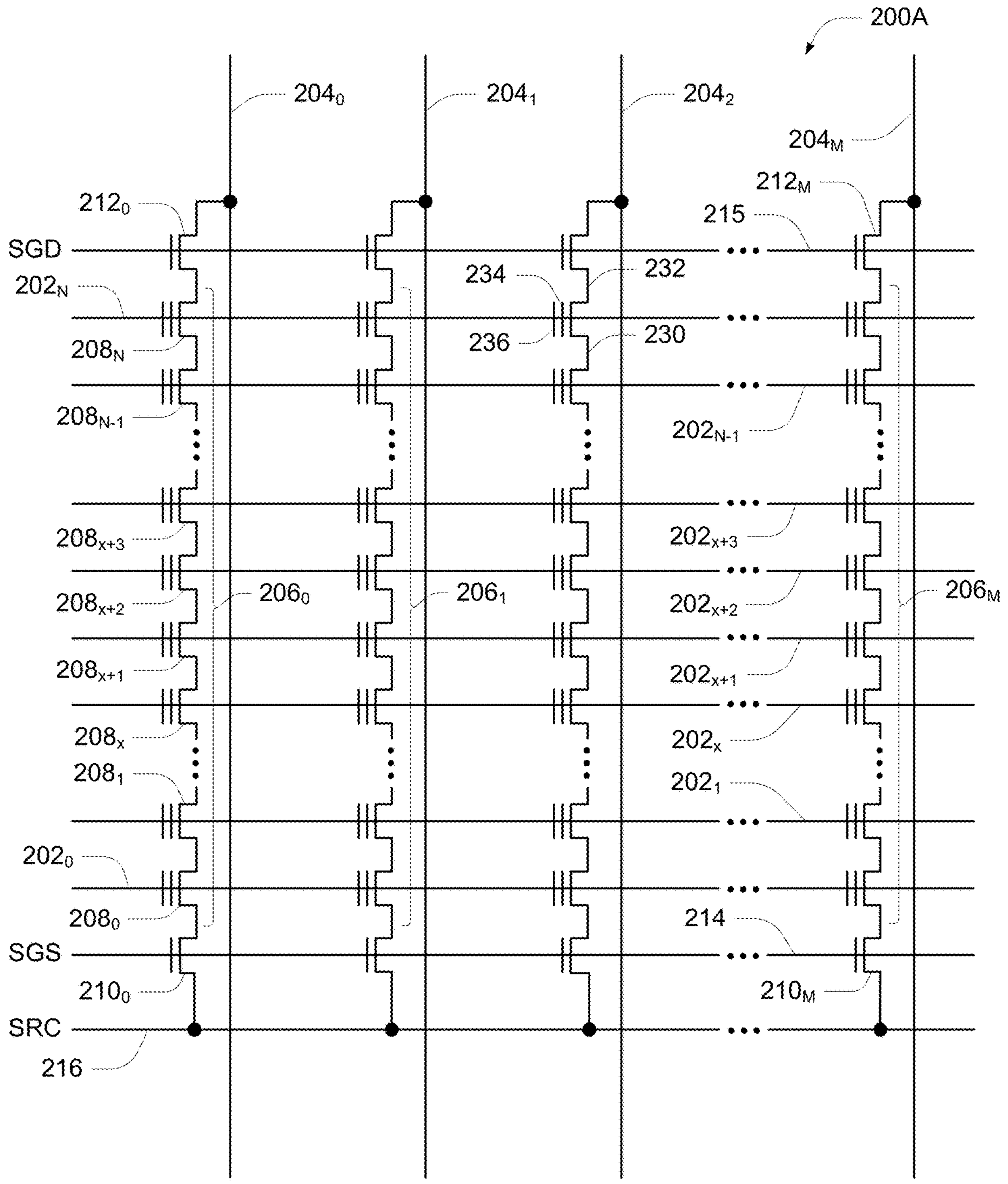
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines (e.g., word lines) $\mathbf{202}_0$ to $\mathbf{202}_N$, and data lines (e.g., bit lines) $\mathbf{204}_0$ to $\mathbf{204}_M$. The access lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $\mathbf{206}_0$ to $\mathbf{206}_M$. Each NAND string 206 might be connected (e.g., selectively connected) to a common source (SRC) 216 and might include memory cells $\mathbf{208}_0$ to $\mathbf{208}_N$. The memory cells 208 might represent non-volatile memory cells for storage of data. The memory cells $\mathbf{208}_0$ to $\mathbf{208}_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $\mathbf{210}_0$ to $\mathbf{210}_M$ (e.g., that might be source select transistors, commonly referred to as select gate source), and a select gate 212 (e.g., a field-effect transistor), such as one of the select gates $\mathbf{212}_0$ to $\mathbf{212}_M$ (e.g., that might be drain select transistors, commonly referred to as select gate drain). Select gates $\mathbf{210}_0$ to $\mathbf{210}_M$ might be commonly connected to a select line 214, such as a source select line (SGS), and select gates $\mathbf{212}_0$ to $\mathbf{212}_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $\mathbf{208}_0$ of the corresponding NAND string 206. For example, the drain of select gate $\mathbf{210}_0$ might be connected to memory cell $\mathbf{208}_0$ of the corresponding NAND string $\mathbf{206}_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $\mathbf{212}_0$ might be connected to the data line $\mathbf{204}_0$ for the corresponding NAND string $\mathbf{206}_0$. The source of each select gate 212 might be connected to a memory cell $\mathbf{208}_N$ of the corresponding NAND string 206. For example, the source of select gate $\mathbf{212}_0$ might be connected to memory cell $\mathbf{208}_N$ of the corresponding NAND string $\mathbf{206}_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $\mathbf{202}_N$ and selectively connected to even data lines 204 (e.g., data lines $\mathbf{204}_0$, $\mathbf{204}_2$, $\mathbf{204}_4$, etc.) might be one physical page of memory cells 208 (e.g., even memory cells) while memory cells 208 commonly connected to access line $\mathbf{202}_N$ and selectively connected to odd data lines 204 (e.g., data lines $\mathbf{204}_1$, $\mathbf{204}_3$, $\mathbf{204}_5$, etc.) might be another physical page of memory cells 208 (e.g., odd memory cells). Although data lines $\mathbf{204}_3$-$\mathbf{204}_5$ are not explicitly depicted in FIG. 2A, it is apparent from the figure that the data lines 204 of the array of memory cells 200A might be numbered consecutively from data line $\mathbf{204}_0$ to data line $\mathbf{204}_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $\mathbf{202}_0$-$\mathbf{202}_N$ (e.g., all NAND strings 206 sharing common access lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS [silicon-oxide-nitride-oxide-silicon] or other data storage structure configured to store charge) and other architectures (e.g., AND arrays, NOR arrays, etc.).

Figure 2B:
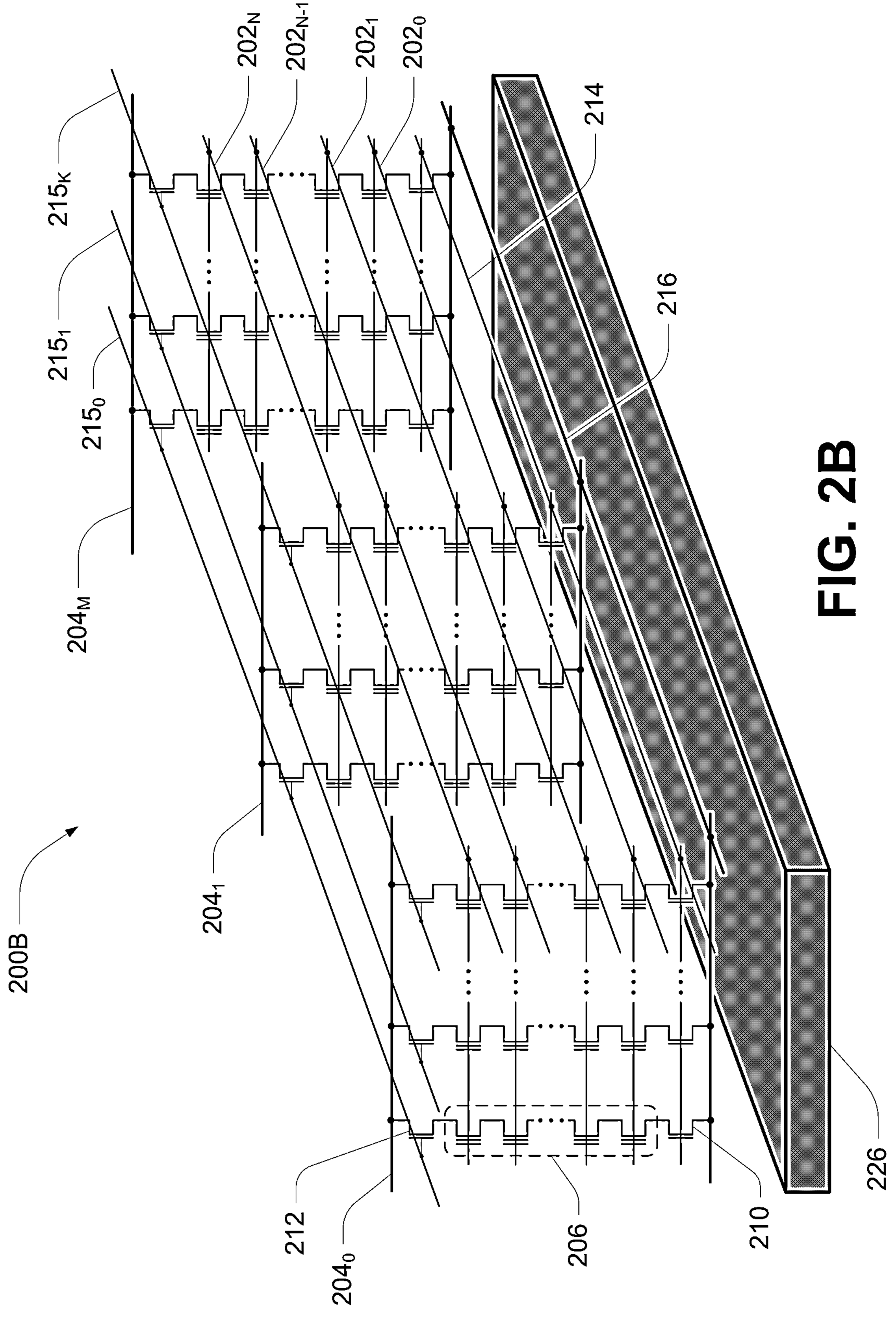

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars, which might be solid or hollow, where a portion of a pillar might act as a channel region of the memory cells of NAND strings 206, e.g., a region through which current might flow when a memory cell, e.g., a field-effect transistor, is activated. The NAND strings 206 might be each selectively connected to a data line $\mathbf{204}_0$-$\mathbf{204}_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $\mathbf{215}_0$-$\mathbf{215}_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel region and p-channel region transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
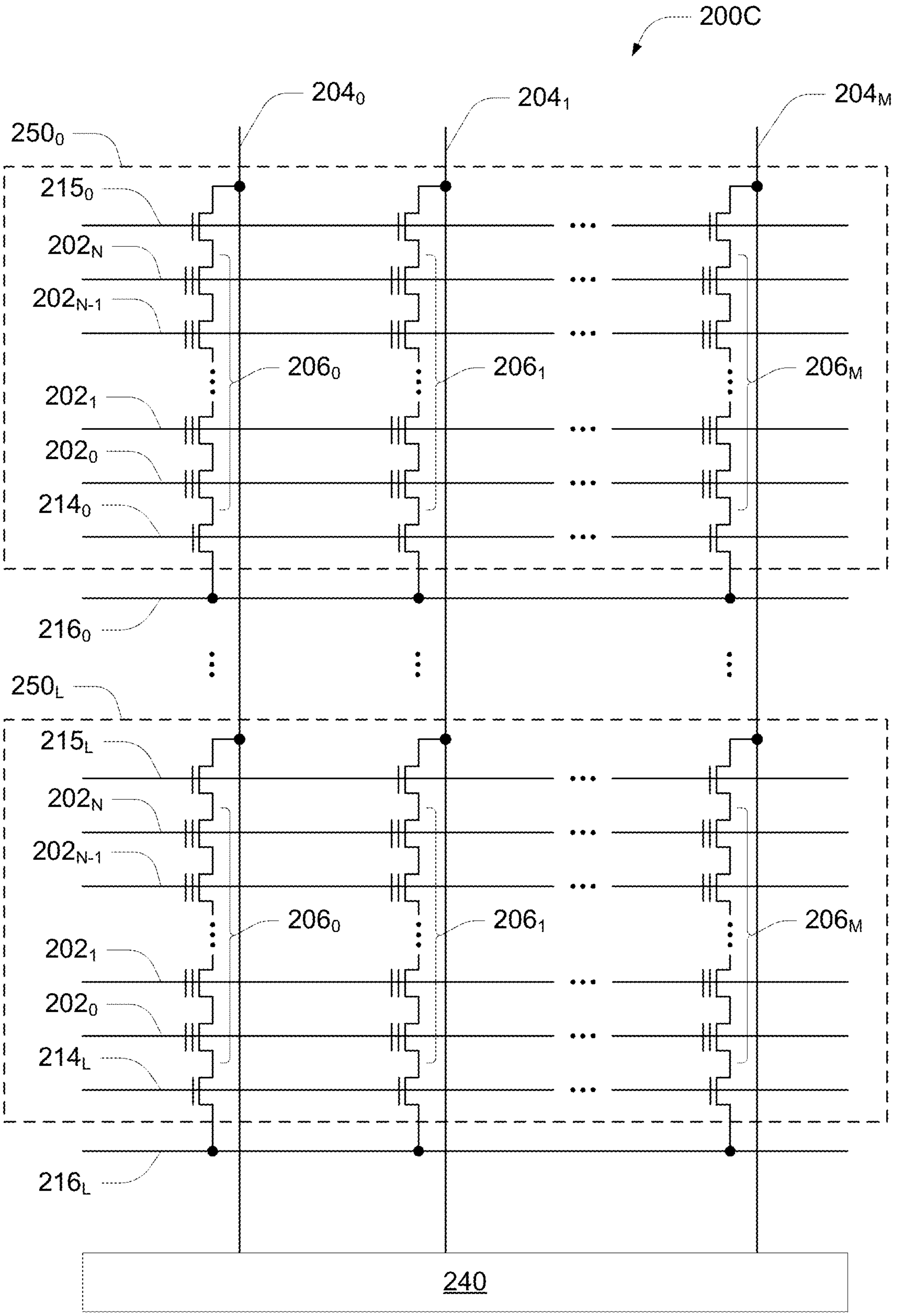

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C might include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A might be a portion of the array of memory cells 200C, for example. FIG. 2C depicts groupings of NAND strings 206 into blocks of memory cells 250, e.g., blocks of memory cells $\mathbf{250}_0$-$\mathbf{250}_L$. Blocks of memory cells 250 might be groupings of memory cells 208 that might be erased together in a single erase operation, sometimes referred to as erase blocks. Each block of memory cells 250 might represent those NAND strings 206 commonly associated with a single select line 215, e.g., select line $\mathbf{215}_0$. The source 216 for the block of memory cells $\mathbf{250}_0$ might be a same source as the source 216 for the block of memory cells $\mathbf{250}_L$. For example, each block of memory cells $\mathbf{250}_0$-$\mathbf{250}_L$ might be commonly selectively connected to the source 216. Access lines 202 and select lines 214 and 215 of one block of memory cells 250 might have no direct connection to access lines 202 and select lines 214 and 215, respectively, of any other block of memory cells of the blocks of memory cells $\mathbf{250}_0$-$\mathbf{250}_L$.

The data lines $\mathbf{204}_0$-$\mathbf{204}_M$ might be connected (e.g., selectively connected) to a buffer portion 240, which might be a portion of a page buffer of the memory. The buffer portion 240 might correspond to a memory plane (e.g., the set of blocks of memory cells $\mathbf{250}_0$-$\mathbf{250}_L$ The buffer portion 240 might include sense circuits (not shown in FIG. 2C) for sensing data values indicated on respective data lines 204.

Figure 3:
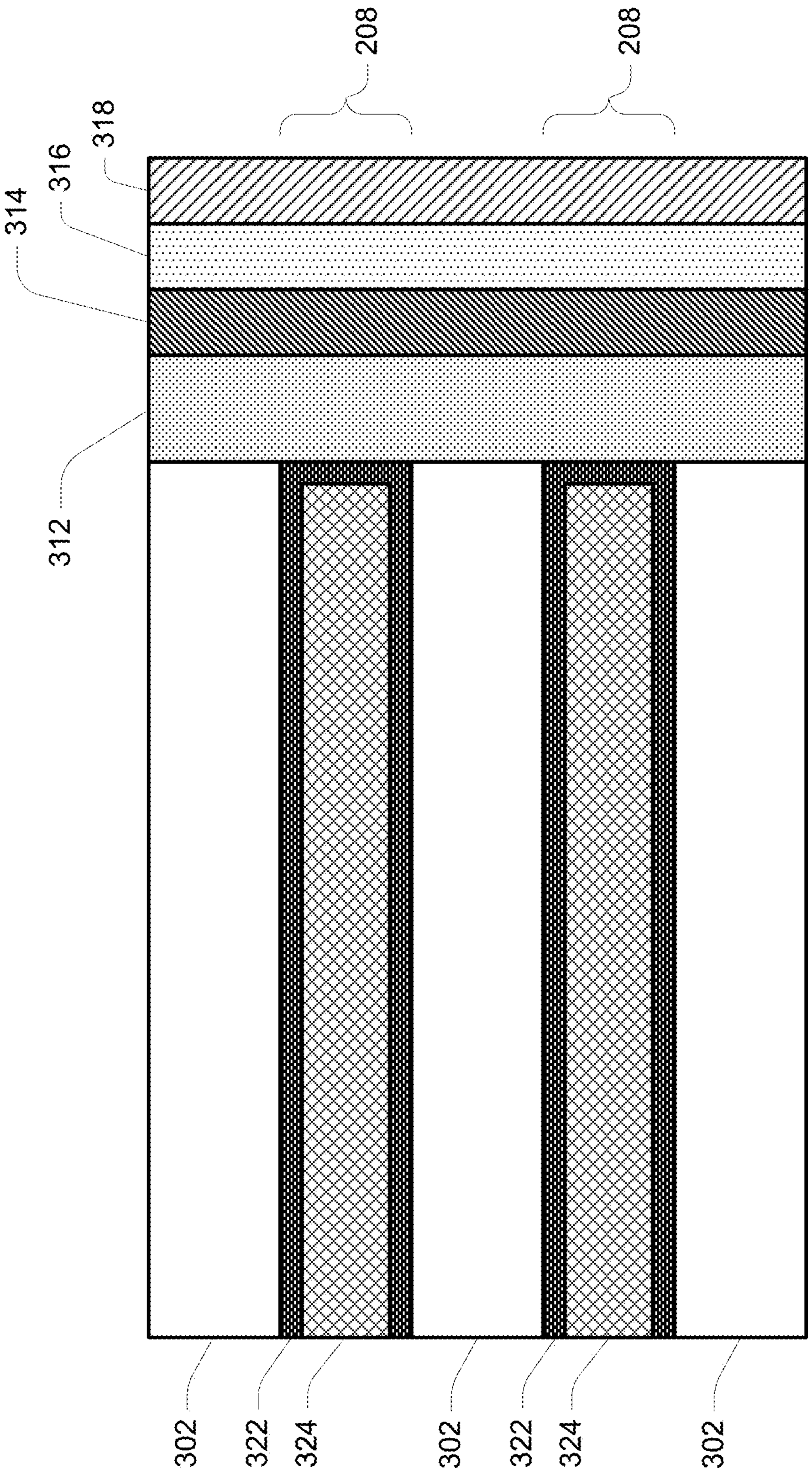
FIG. 3 Related Art
FIG. 3 depicts a cross-sectional view of a memory array structure of the related art.

FIG. 3 depicts a cross-sectional view of a memory array structure of the related art. In particular, FIG. 3 depicts portions of two memory cells 208 of a 3D NAND memory array. Each memory cell 208 might include a respective portion of a channel material structure 318, and respective portions of a gate dielectric 316, a charge-storage structure 314, and a charge-blocking structure 312, which collectively might correspond to the data-storage structure 234 of FIG. 2A. Each memory cell 208 might further include a control gate 324 (e.g., corresponding to the control gate 236 of FIG. 2A), and an optional high-K dielectric 322 between its control gate 324 and its respective portion of the charge-blocking structure 312. Memory cells 208 might be isolated from one another by instances of a dielectric 302. Note that the charge-blocking structure 312 of FIG. 3 has a same composition between its charge-storage structure 314 and the high-K dielectrics 322 as it does between its charge-storage structure 314 and the instances of dielectric 302.

Figure 4:
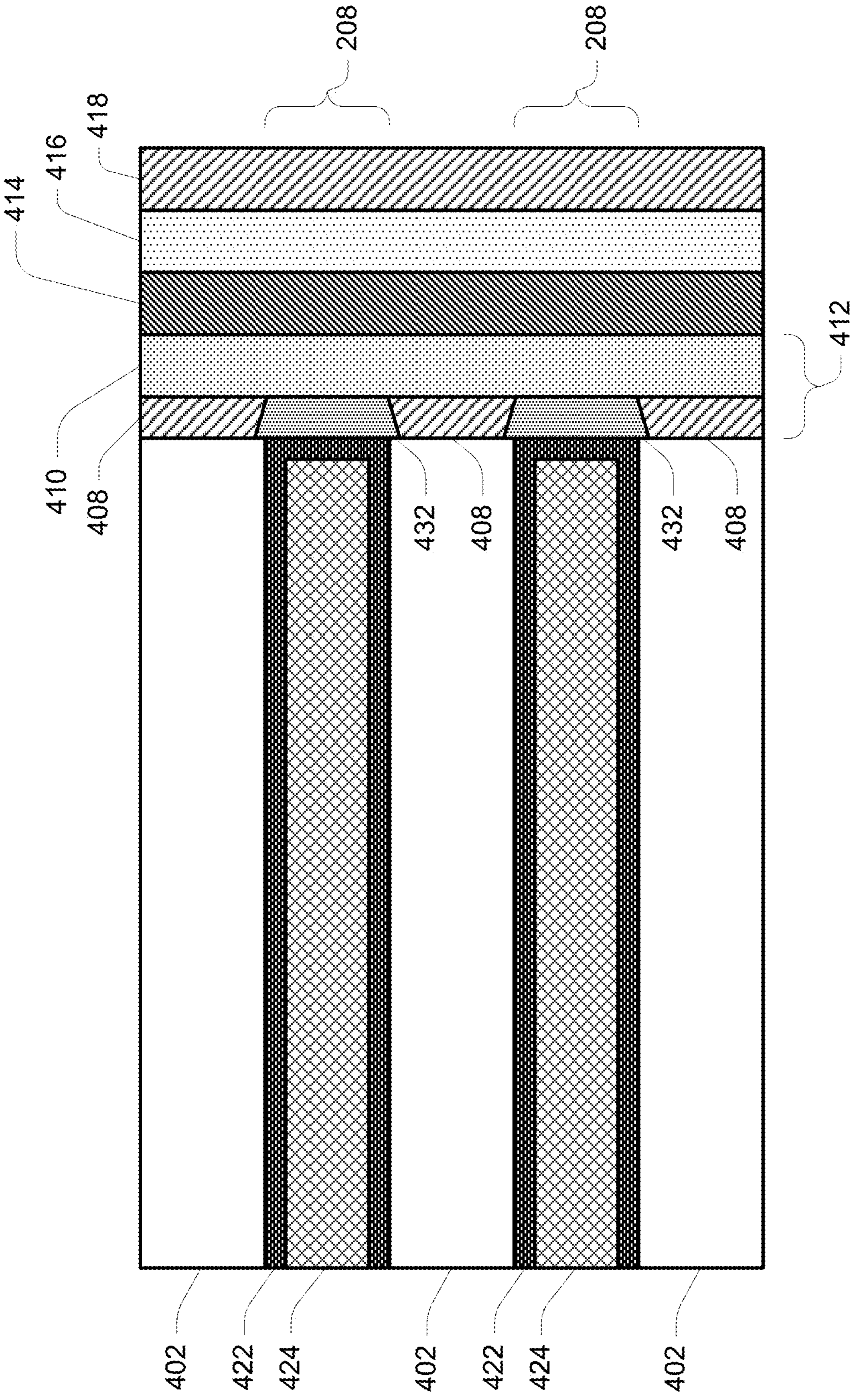
FIG. 4 depicts a cross-sectional view of a memory array structure in accordance with an embodiment.

FIG. 4 depicts a cross-sectional view of a memory array structure in accordance with an embodiment. In particular, FIG. 4 depicts portions of two memory cells 208 of a 3D NAND memory array. Each memory cell 208 might include a respective portion of a channel material structure 418, and respective portions of a gate dielectric structure 416, a charge-storage structure 414, and a charge-blocking structure 412, which collectively might correspond to the data-storage structure 234 of FIG. 2A. Each memory cell 208 might further include a control gate 424 (e.g., corresponding to the control gate 236 of FIG. 2A), and an optional high-K dielectric 422 between its control gate 424 and its respective portion of the charge-blocking structure 412. Memory cells 208 might be isolated from one another by instances of a first dielectric material 402. For a memory cell 208, the respective portions of the channel material structure 418, the gate dielectric structure 416, the charge-storage structure 414, and the charge-blocking structure 412, might each include those portions of the channel material structure 418, the gate dielectric structure 416, the charge-storage structure 414, and the charge-blocking structure 412, respectively, extending from a plane defined by the uppermost surface of the control gate 424 of the memory cell 208 to a plane defined by the lowermost surface of the control gate 424 of the memory cell 208.

In contrast to the example of FIG. 3, the charge-blocking structure 412 of FIG. 4 has a different composition between its charge-storage structure 414 and the high-K dielectrics 422, or control gate 424, than it does between its charge-storage structure 414 and the instances of first dielectric material 402. For example, the charge-blocking structure 412 of FIG. 4 might have a second dielectric material 408 adjacent to (e.g., immediately adjacent to) a sidewall of an instance of first dielectric material 402, and a third dielectric material 410 adjacent to (e.g., immediately adjacent to) the second dielectric material 408, e.g., in a direction extending away from the sidewall of the first dielectric material 402.

The charge-blocking structure 412 of FIG. 4 might further have a fourth dielectric material 432 adjacent to (e.g., immediately adjacent to) a sidewall of a high-K dielectric 422, or optionally adjacent to (e.g., immediately adjacent to) a sidewall of a control gate 424, and the third dielectric material 410 adjacent to (e.g., immediately adjacent to) the fourth dielectric material 432. In other words, the charge-blocking structure 412 might have a second dielectric material 408, a third dielectric material 410, and a fourth dielectric material 432, where instances of the second dielectric material 408 are adjacent to (e.g., immediately adjacent to) instances of the first dielectric material 402, and where instances of the fourth dielectric material 432 are adjacent to (e.g., immediately adjacent to) instances of the high-K dielectric 422 which might be adjacent to (e.g., immediately adjacent to) respective control gates 424. An instance of the fourth dielectric material 432 for one memory cell 208 and an instance of the fourth dielectric material 432 for an adjacent to (e.g., immediately adjacent to) memory cell 208 might be separated by an instance of the second dielectric material 408.

For some embodiments, the respective portion of the charge-blocking structure 412 for each memory cell 208 might be devoid of the second dielectric material. For some embodiments, the third dielectric material 410 and the fourth dielectric material 432 might contain a same dielectric material. For some embodiments, the third dielectric material 410 and the fourth dielectric material 432 might each contain silicon dioxide. For some embodiments, the third dielectric material 410 and the fourth dielectric material 432 might each consist essentially of silicon dioxide. The fourth dielectric material 432 might be an oxidation reaction product of the second dielectric material 408. Compositions for use in various embodiments might contain additional chemical components that do not materially affect the basic and novel properties of the dielectric structures disclosed herein. Some examples might include contaminants or reaction by-products at levels of less than 5 wt % of the desired composition.

The second dielectric material 408 might have a dielectric constant (K), e.g., relative permittivity, that is different than the dielectric constant of the fourth dielectric material 432. Having instances of the second dielectric material 408 between instances of the fourth dielectric material 432 might be used to adjust properties of the memory array structure. As one example, selecting the second dielectric material 408 to have a lower dielectric constant than the fourth dielectric material 432 might facilitate reduced pitch between adjacent memory cells while maintaining similar cell-to-cell interference characteristics. Alternatively, selecting the second dielectric material 408 to have a higher dielectric constant than the fourth dielectric material 432 might facilitate improvement of erase saturation and a reduction in thickness of the charge-blocking structure 412.

FIGS. 5A-5K depict cross-sectional views of a memory array structure during various stages of fabrication in accordance with an embodiment. For example, FIGS. 5A-5K might depict fabrication of an upper portion of a string of series-connected memory cells, e.g., a NAND string 206, and one or more select gates, e.g., select gates 212, for connection to a data line 204. FIGS. 5A-5K might be used to depict fabrication of an array of memory cells in accordance with an embodiment, for example.

Figure 5A:
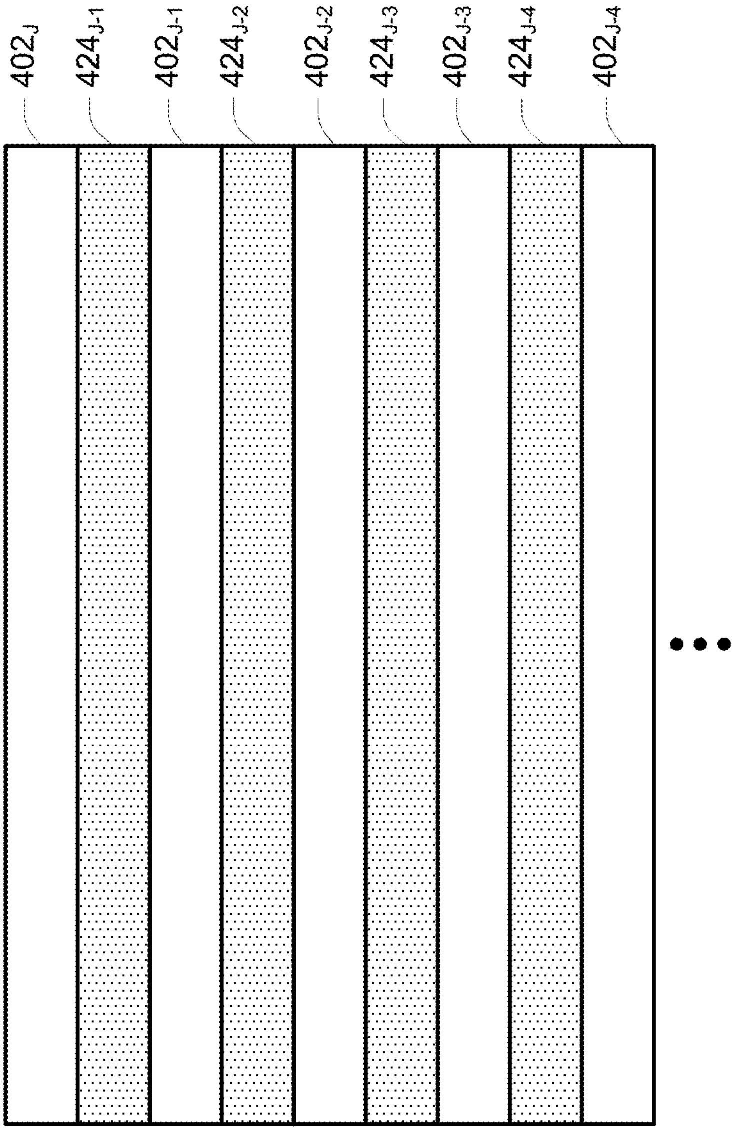
FIGS. 5A-5K depict cross-sectional views of a memory array structure during various stages of fabrication in accordance with an embodiment.

In FIG. 5A, J+1 instances of a first dielectric material 402 (e.g., 402$_0$ to 402$_J$) and J instances of a sacrificial material 404 (e.g., 404$_0$ to 404$_{J-1}$) might be formed in an alternating manner. Although instances of the first dielectric material 402$_0$-402$_{J-5}$, and instances of sacrificial material 404$_0$-404$_{J-5}$, are not explicitly depicted in the figures, it will be understood that an instance of the first dielectric material 402$_0$ could be formed overlying a common source 216 (e.g., formed on a contact to the common source 216), the instance of the sacrificial material 404$_0$ could be formed on the instance of the first dielectric material 402$_0$, and subsequent instances of the first dielectric material 402 and sacrificial material 404 could be formed in an alternating manner as depicted in the figures.

The value J might represent the number of transistors to be formed around the channel material structure 444$_0$ of FIG. 5A between a connection to a common source 216 and a data line 204. The instances of the first dielectric material 402 might each contain one or more dielectric materials. The instances of first dielectric material 402 might comprise, consist of, or consist essentially of an oxide, e.g., silicon dioxide ($SiO_2$), and/or might comprise, consist of, or consist essentially of a high-K dielectric material, such as aluminum oxides ($AlO_x$), hafnium oxides ($HfO_x$), hafnium aluminum oxides ($HfAlO_x$), hafnium silicon oxides ($HfSiO_x$), lanthanum oxides ($LaO_x$), tantalum oxides ($TaO_x$), zirconium oxides ($ZrO_x$), zirconium aluminum oxides ($ZrAlO_x$), or yttrium oxide ($Y_2O_3$), as well as any other dielectric material. High-K dielectrics as used herein means a material having a dielectric constant greater than that of silicon dioxide. The instances of first dielectric material 402 might further comprise, consist of, or consist essentially of a spin-on dielectric material, e.g., hydrogen silsesquioxane (HSQ), hexamethyldisiloxane, octamethyltrisiloxane, etc., or a high-density-plasma (HDP) oxide. The instances of first dielectric material 402 might further comprise, consist of, or consist essentially of any other dielectric material. As one example, the instances of the first dielectric material 402 might contain silicon dioxide.

The instances of the sacrificial material 404 might contain a material that can be subjected to removal without significantly affecting the material(s) of the first dielectric material 402. As one example, the instances of the sacrificial material 404 might contain silicon nitride for instances of the first dielectric material 402 containing silicon dioxide. Additional instances of the first dielectric material 402 and instances of the sacrificial material 404 might be formed, depending upon the number of transistors intended to be formed, e.g., memory cells, dummy memory cells, GIDL (gate-induced drain leakage) generator gates, select gates and pre- configured select gates. While all intended instances of the first dielectric material 402 and instances of the sacrificial material 404 might be formed before proceeding to the processing of FIG. 5B, typical processing of such stacked structures might be performed in stages as the aspect ratio of a via formed through the instances of the first dielectric material 402 and the instances of the sacrificial material 404 might become too large to form the entire structure reliably as a contiguous entity.

Figure 5B:
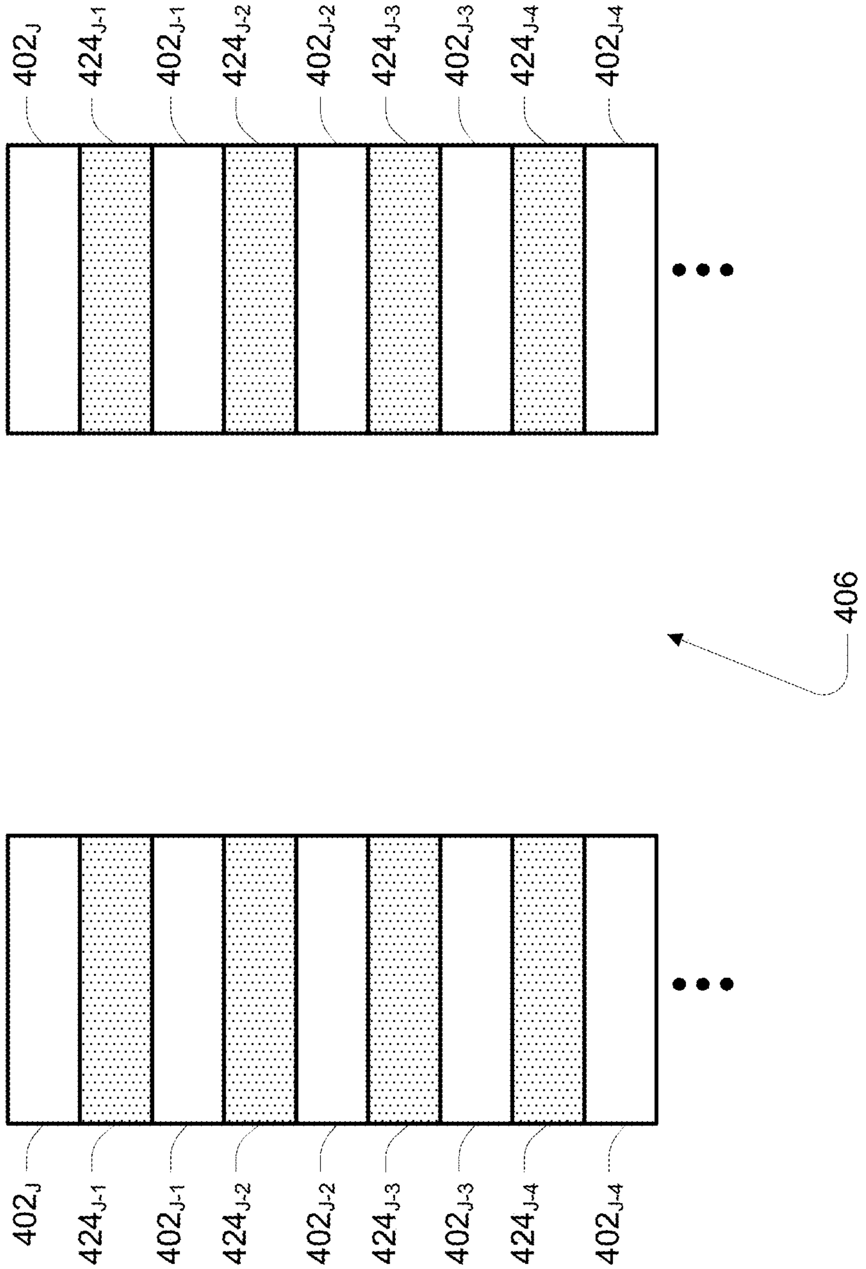

In FIG. 5B, a via 406 might be formed through the instances of the first dielectric material 402 and the instances of the sacrificial material 404. For example, an anisotropic removal process, e.g., reactive ion etching (ME), might be used with a contact to the common source 216 (not depicted in FIG. 5B) acting as an etch stop. As such, the via 406 might extend through all instances of the first dielectric material 402 and through all instances of the sacrificial material 404.

Figure 5C:
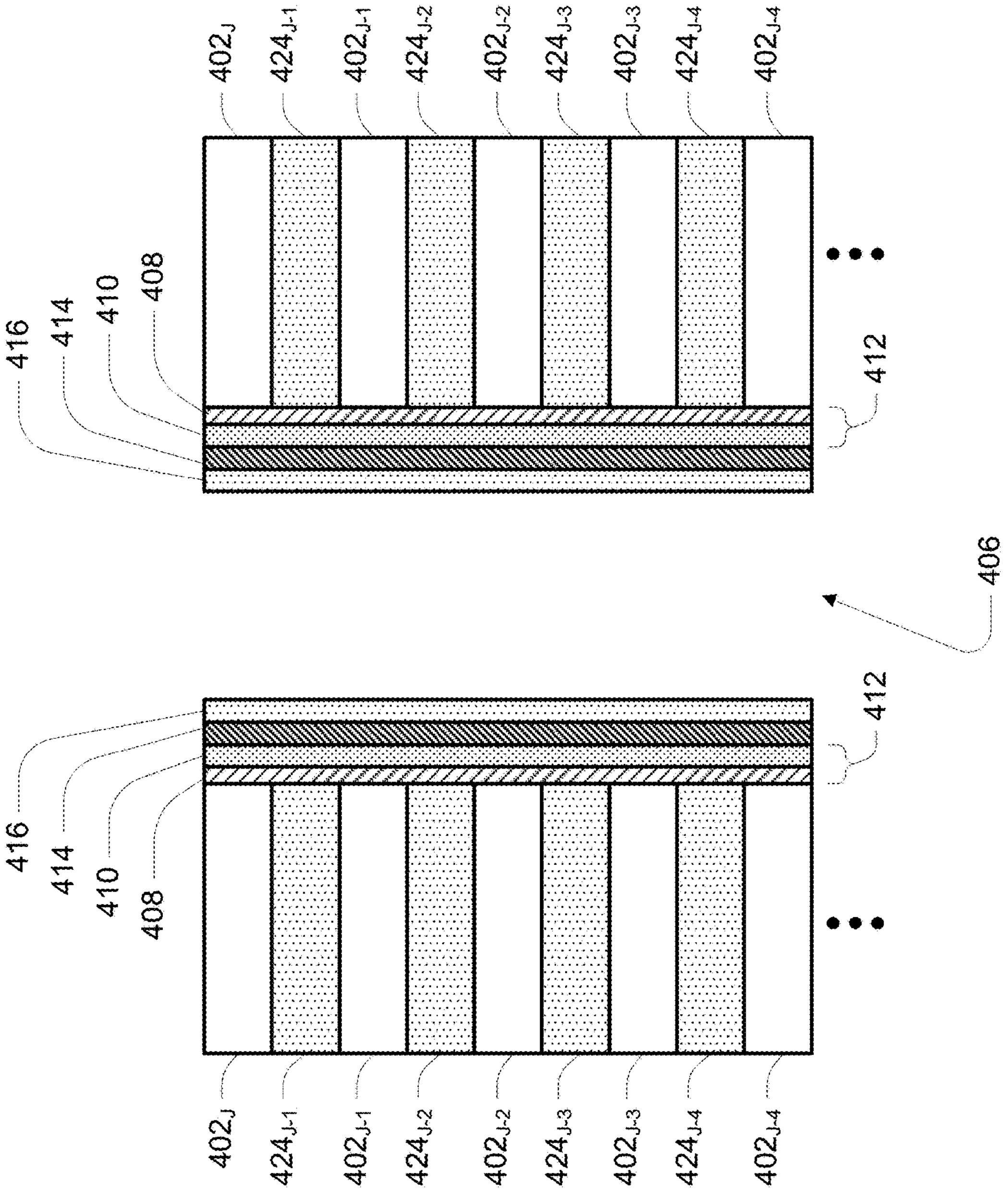

In FIG. 5C, a second dielectric material 408 might be formed adjacent to (e.g., overlying or on) the sidewalls of the via 406, e.g., formed along the sidewalls of the instances of the first dielectric material 402 and the instances of the sacrificial material 404. The second dielectric material 408 might include any dielectric material capable of being subjected to reaction conditions and converted to a different dielectric material having a different dielectric constant. For example, the second dielectric material 408 might include any silicon-containing dielectric material that could be converted to silicon dioxide through oxidation. Some examples of high-K silicon-containing dielectric materials might include polycrystalline silicon (e.g., polysilicon), amorphous silicon, silicon nitride (e.g., $Si_3N_4$), silicon oxynitride (e.g., SiON), etc. Some examples of low-K silicon-containing dielectric materials might include carbon-doped silicon oxynitride, boron-doped silicon oxynitride, etc. A thickness of the second dielectric material 408 might be in a range of 2-10 nm. For some embodiments, the thickness of the second dielectric material 408 might be in a range of 3-5 nm to facilitate beneficial field distortion in an applied range of −10 V to 10 V.

A third dielectric material 410 might be formed adjacent to (e.g., overlying or on) surfaces of the second dielectric material 408 within the via 406. The third dielectric material 410 might be a dielectric material different than the second dielectric material 408. Otherwise, the third dielectric material 410 might comprise, consist of, or consist essentially of an oxide, e.g., silicon dioxide ($SiO_2$), and/or might comprise, consist of, or consist essentially of a high-K dielectric material, such as aluminum oxides ($AlO_x$), hafnium oxides ($HfO_x$), hafnium aluminum oxides ($HfAlO_x$), hafnium silicon oxides ($HfSiO_x$), lanthanum oxides ($LaO_x$), tantalum oxides ($TaO_x$), zirconium oxides ($ZrO_x$), zirconium aluminum oxides ($ZrAlO_x$), or yttrium oxide ($Y_2O_3$), as well as any other dielectric material. The second dielectric material 408 and the third dielectric material 410 might form portions of the charge-blocking structure 412.

A charge-storage structure 414 might be formed adjacent to (e.g., overlying or on) surfaces of the third dielectric material 410. The charge-storage structure 414 might contain a dielectric charge-storage material, e.g., configured to accept and retain charge. The charge-storage structure 414 might further contain both dielectric and conductive materials, e.g., conductive nano-particles in a dielectric bulk material. For charge-storage structure 414 containing a dielectric material as its bulk, or as a continuous structure, resulting memory cells might typically be referred to as charge-trap memory cells. For one embodiment, the charge-storage structure 414 might include silicon nitride.

A gate dielectric structure 416 might be formed adjacent to (e.g., overlying or on) surfaces of the charge-storage structure 414. The gate dielectric structure 416 might function as a tunneling dielectric for future memory cells and other transistors having a same structure, and might include one or more dielectric materials such as described with reference to the instances of first dielectric material 402. For one embodiment, the gate dielectric structure 416 might contain silicon dioxide.

Figure 5D:
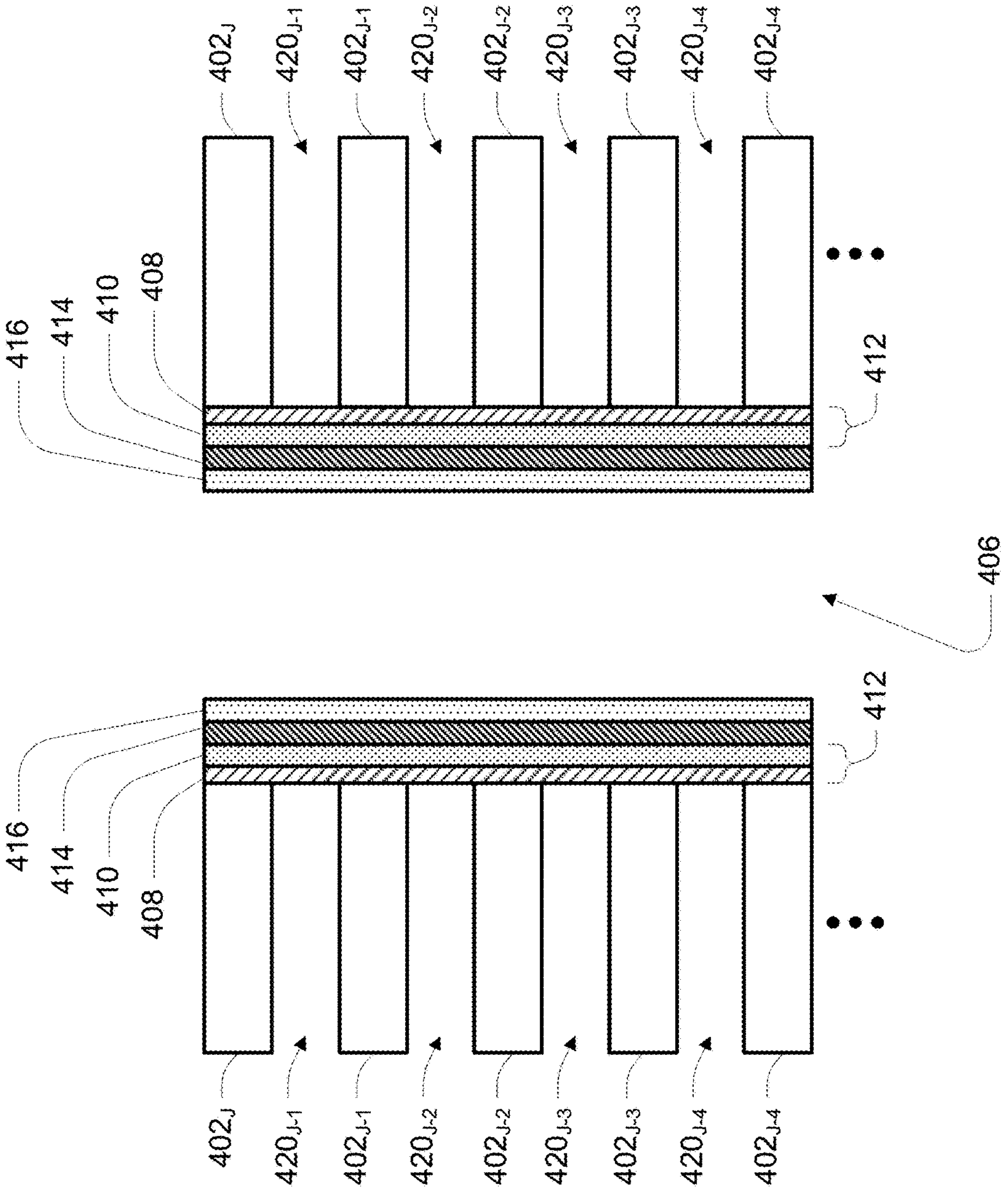
Figure 5E:
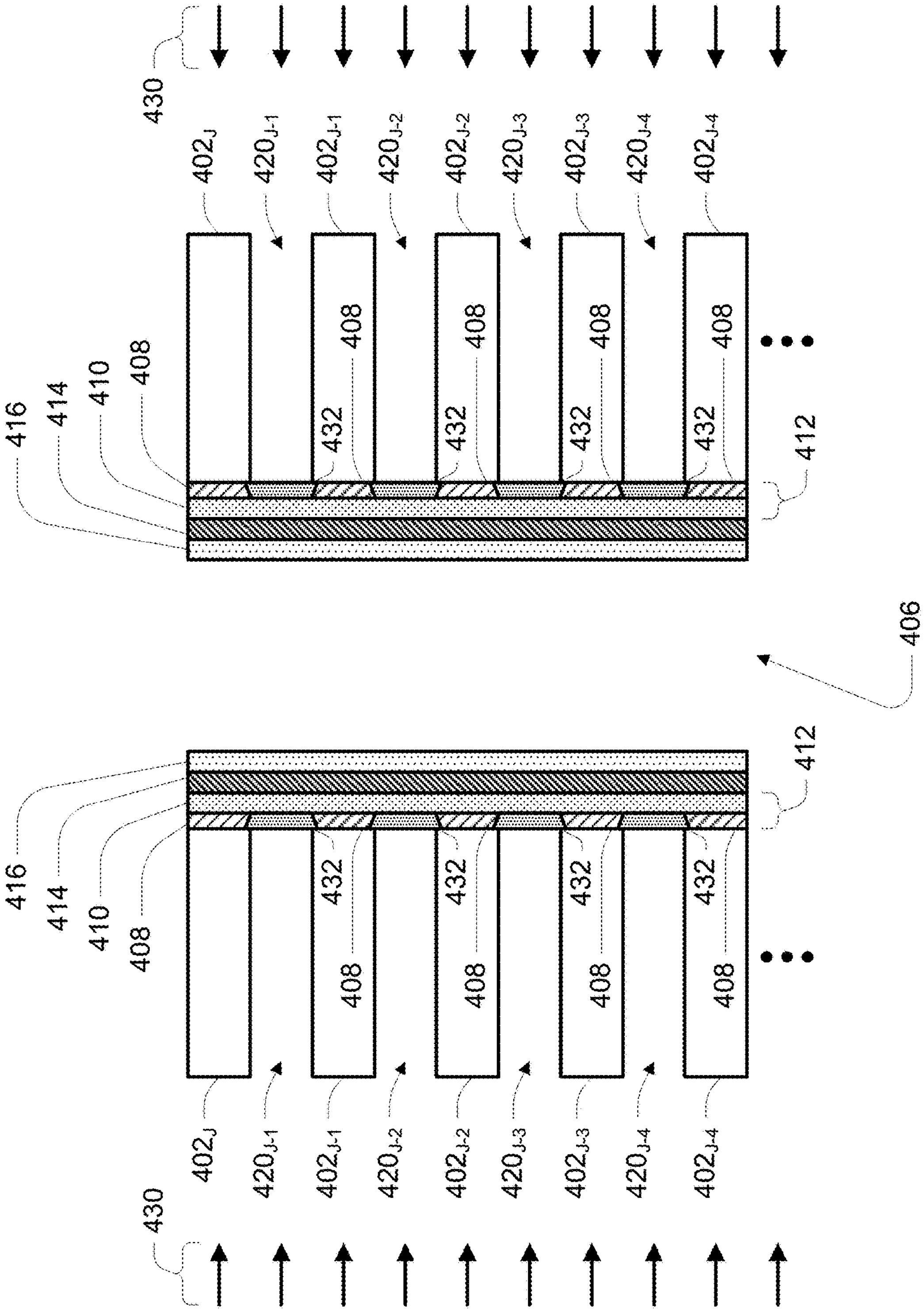

In FIG. 5D, the instances of sacrificial material 404 might be removed to define voids 420, e.g., voids 420$_{J-1}$ to 420$_{J-4}$. The removal might include an isotropic removal process, e.g., a plasma etching process or wet etching process. In FIG. 5E, exposed portions of the second dielectric material 408 of the charge-blocking structure 412 from the structure of FIG. 5D might be subjected to radical oxidation as depicted conceptually by arrows 430, thus forming instances of a fourth dielectric material 432 at the end of each void 420 through reaction (e.g., oxidation) of the second dielectric material 408, and leaving portions of the second dielectric material 408 unreacted adjacent to the instances of the first dielectric material 402. It is expected that portions of the instances of the fourth dielectric material 432 might extend to areas adjacent to (e.g., immediately adjacent to) portions of sidewalls of instances of the first dielectric material 402. As such, a height (e.g., vertically in FIG. 5D) of an instance of the fourth dielectric material 432 might be larger than a height of an adjacent instance of the second dielectric material 408 even in cases where a height of an instance of the first dielectric material 402 and a height of an instance of the sacrificial material 404 are equal. Each pair of adjacent instances of the fourth dielectric material 432 might have an instance of the unreacted second dielectric material 408 therebetween. For example, the adjacent instances of the fourth dielectric material 432 at the ends of voids 420$_{J-1}$ and 420$_{J-2}$ might have the instance of the unreacted second dielectric material 408 adjacent the instance of the first dielectric material 402$_{J-1}$ therebetween, the adjacent instances of the fourth dielectric material 432 at the ends of voids 420$_{J-2}$ and 420$_{J-3}$ might have the instance of the unreacted second dielectric material 408 adjacent the instance of the first dielectric material 402$_{J-2}$ therebetween, and so on.

Radical oxidation might include an in-situ steam generation (ISSG) process. This might include heating the structure of FIG. 5E to a temperature in a range of about 600° C. to 1050° C., and exposing the structure to a gas mixture gas mixture comprising, consisting essentially of, or consisting of hydrogen and oxygen. The gas mixture might be introduced at low pressure, typically below 20 torr. As a result, the hydrogen and oxygen might combust on or near surfaces of the structure to form radicals, including oxygen radicals, which might then oxidize the exposed portions of the second dielectric material 408. Other methods might also be used to generate oxygen radicals, such as light-induced dissociation of oxygen sources, or plasma processes.

Figure 5F:
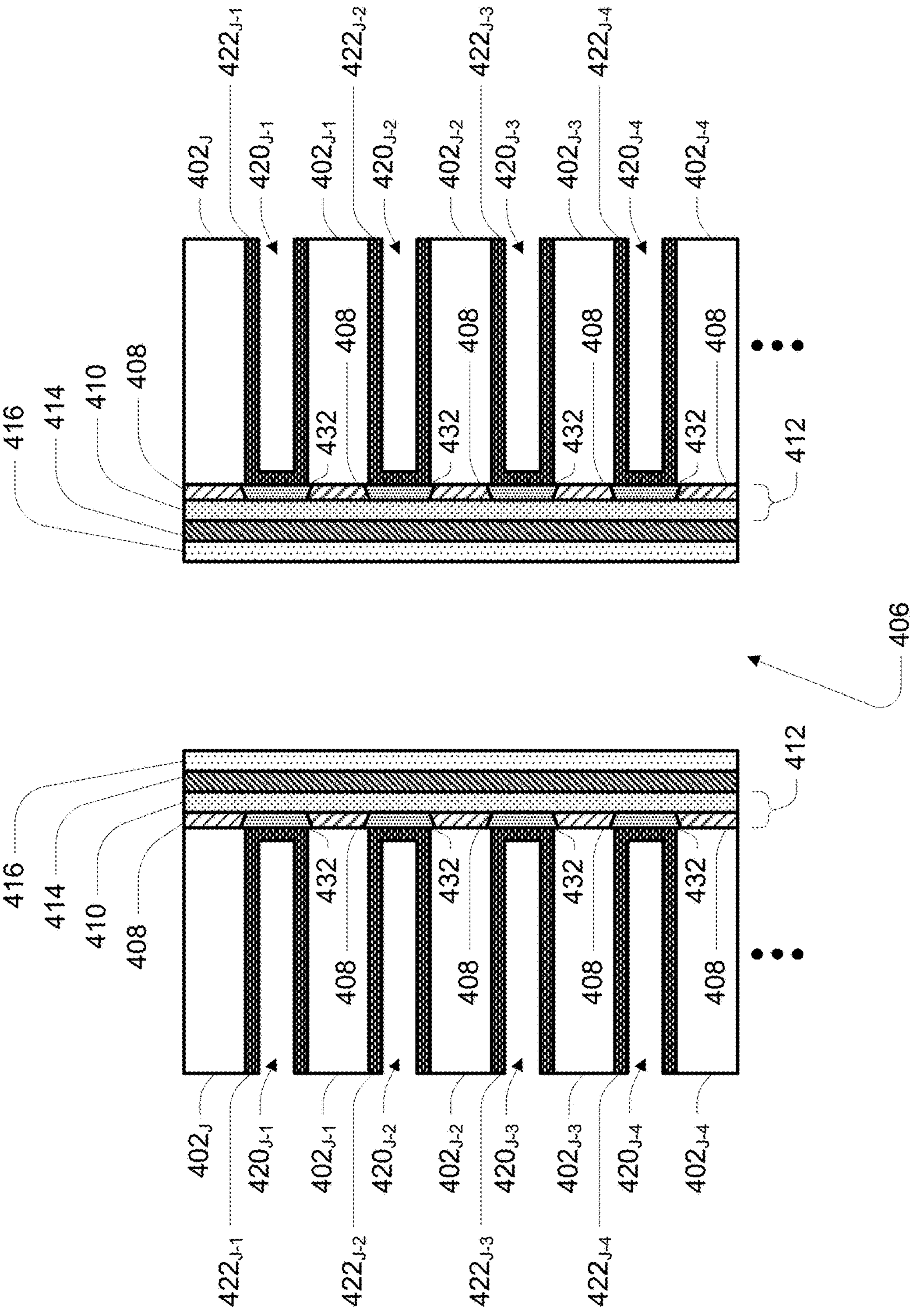

In FIG. 5F, instances of an optional high-K dielectric material 422, e.g., instances of high-K dielectric material 422$_{J-1}$ to 422$_{J-4}$, might be formed to line the voids 420, e.g., voids 420$_{J-1}$ to 420$_{J-4}$, respectively. The instances of high-K dielectric material 422 might include one or more high-K dielectric materials. The instances of high-K dielectric material 422 might comprise, consist of, or consist essentially of a high-K dielectric material, such as aluminum oxides ($AlO_x$), hafnium oxides ($HfO_x$), hafnium aluminum oxides ($HfAlO_x$), hafnium silicon oxides ($HfSiO_x$), lanthanum oxides ($LaO_x$), tantalum oxides ($TaO_x$), zirconium oxides ($ZrO_x$), zirconium aluminum oxides ($ZrAlO_x$), or yttrium oxide ($Y_2O_3$), as well as any other high-K dielectric material.

Figure 5G:
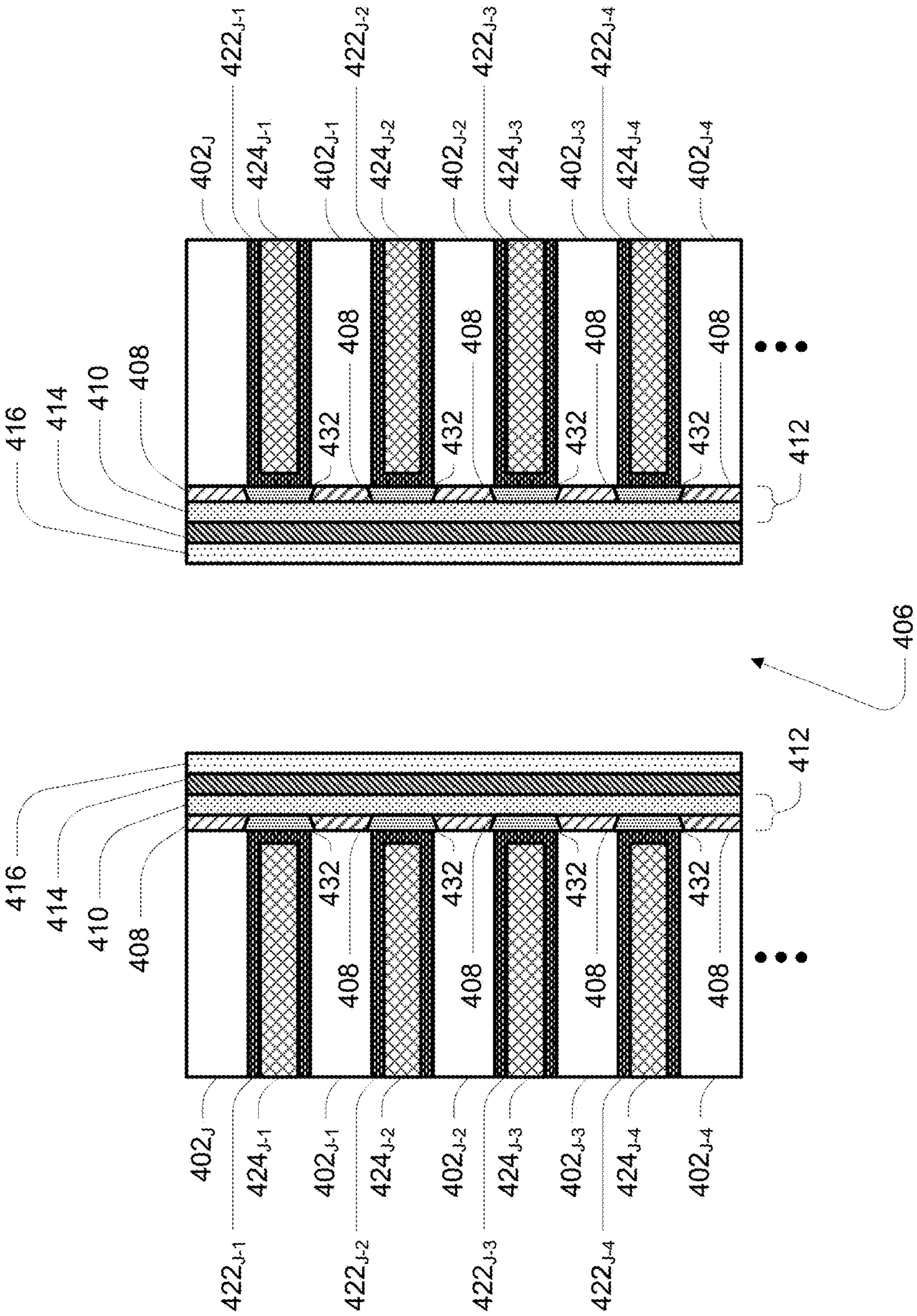

In FIG. 5G, instances of a conductor 424, e.g., instances of a conductor 424$_{J-1}$ to 424$_{J-4}$, might be formed to fill the voids 420, e.g., voids 420$_{J-1}$ to 420$_{J-4}$, respectively. The instances of the conductor 424 might contain one or more conductive materials. The instances of the conductor 424 might comprise, consist of, or consist essentially of conductively doped polysilicon and/or might comprise, consist of, or consist essentially of metal, such as a refractory metal, or a metal-containing material, such as a refractory metal silicide or a metal nitride, e.g., a refractory metal nitride, as well as any other conductive material. The instances of the conductor 424 might correspond to a control gate of a completed transistor.

Figure 5H:
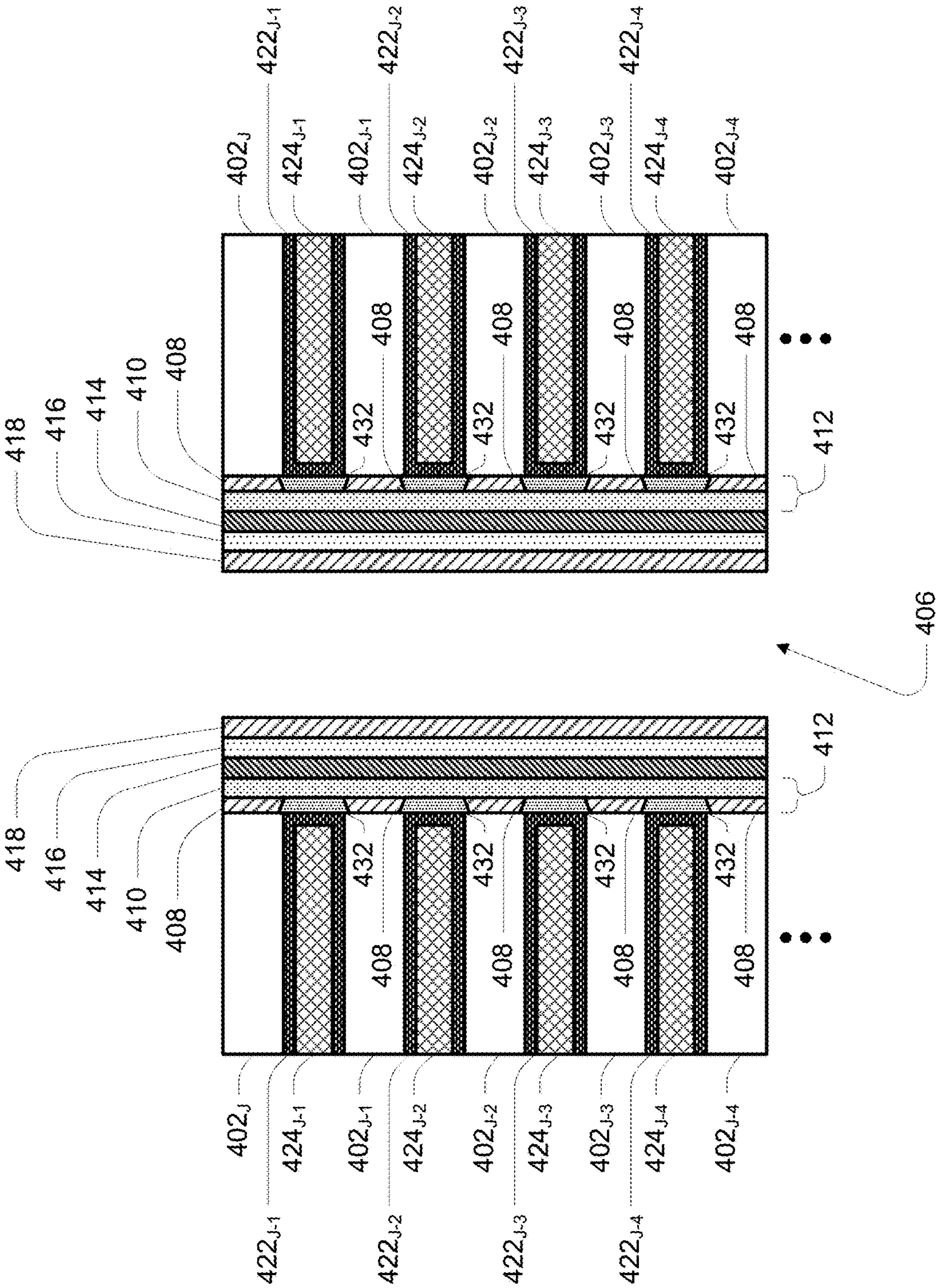

In FIG. 5H, a channel material structure 418 might be formed adjacent to (e.g., overlying or on) surfaces of the gate dielectric structure 416. It might be desirable to form the channel material structure 418 after subjecting the second dielectric material 408 to radical oxidation, to avoid oxidation of the channel material structure 418. However, its surfaces could be protected by forming a protective, e.g., sacrificial, layer over the channel material structure 418 prior to oxidation of the second dielectric material 408. In addition, although the third dielectric material 410, the charge-storage structure 414 and the gate dielectric structure 416 were formed with reference to FIG. 5C prior to radical oxidation, they could be formed at any time after formation of the second dielectric material 408 and prior to formation of the channel material structure 418. The channel material structure 418 might be a portion of a contiguous semiconductor structure for each transistor formed around the via 406, or might otherwise be electrically connected, which might include selectively electrically connected, to channels of each such transistor. The channel material structure 418 might function as a channel for future memory cells and other transistors having a same structure, and might include one or more semiconductor materials. The channel material structure 418 might include a semiconductor material having a conductivity type, e.g., a p-type conductivity or an n-type conductivity, and might have sufficient conductivity such that its corresponding transistors have a negative threshold voltage absent charge stored in a corresponding portion of the charge-storage structure 414. With the formation of the channel material structure 418, each instance of the conductor 424 might be referred to herein as a control gate 424.

Each control gate 424 might surround a respective portion of the charge-blocking structure 412 (e.g., including a respective instance of the fourth dielectric material 432 and a respective portion of the third dielectric material 410), a respective portion of the charge-storage structure 414, a respective portion of the gate dielectric structure 416, and a respective portion of the channel material structure 418, at a respective level of the array structure for each control gate 424. Each instance of the first dielectric material 402 might surround a respective portion of the charge-blocking structure 412 (e.g., including a respective instance of the second dielectric material 408 and a respective portion of the third dielectric material 410), a respective portion of the charge-storage structure 414, a respective portion of the gate dielectric structure 416, and a respective portion of the channel material structure 418, at a respective level of the array structure for each instance of the first dielectric material 402.

Figure 5I:
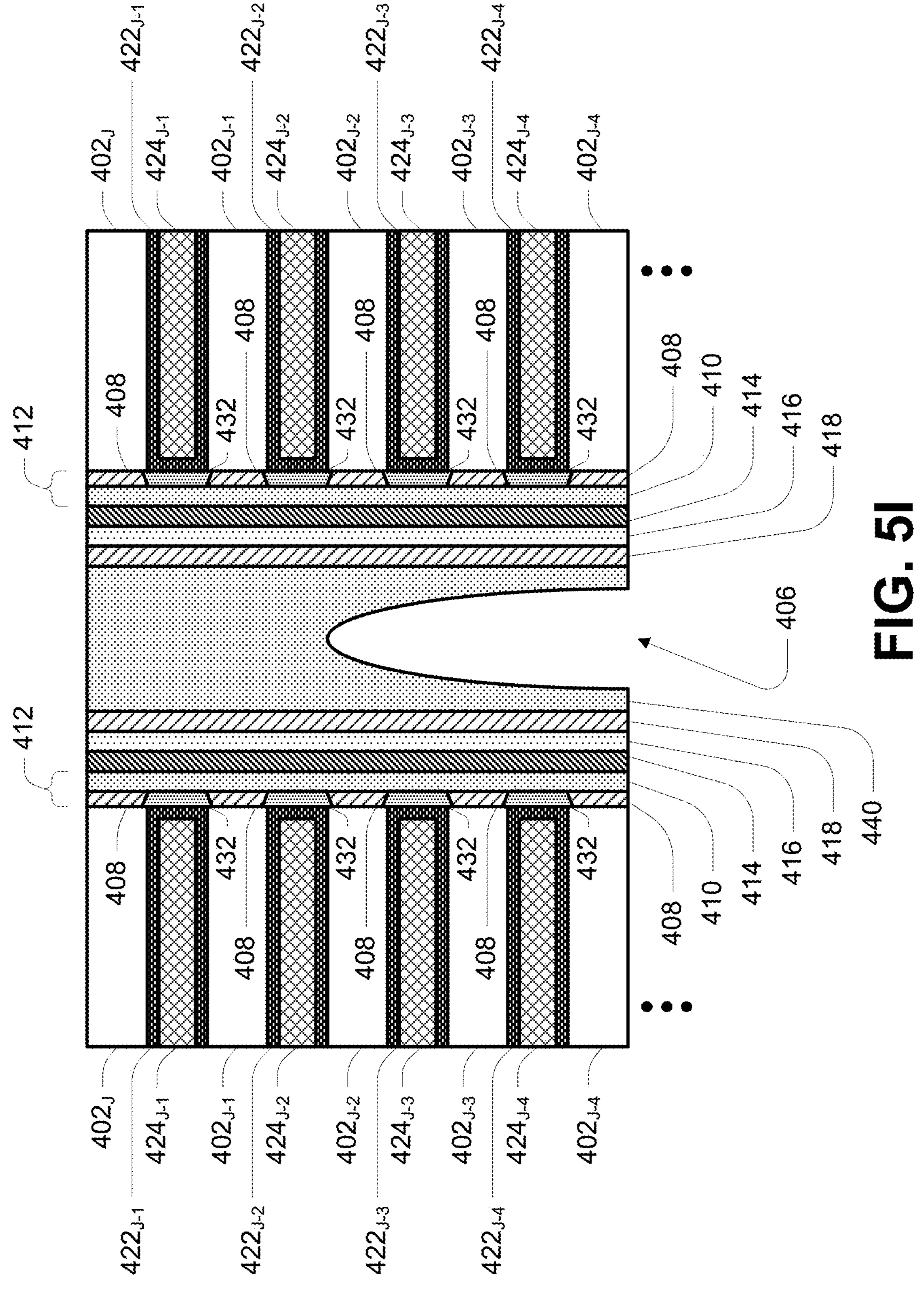

In FIG. 5I, a dielectric 440 might optionally be formed in the via 406. The dielectric 440 might contain one or more dielectric materials. The dielectric 440 might comprise, consist of, or consist essentially of an oxide, e.g., silicon dioxide ($SiO_2$). The dielectric 440 might further comprise, consist of, or consist essentially of a spin-on dielectric material, e.g., hydrogen silsesquioxane (HSQ), hexamethyldisiloxane, octamethyltrisiloxane, etc., or a high-density-plasma (HDP) oxide. The dielectric 440 might further comprise, consist of, or consist essentially of any other dielectric material. The dielectric 440 might contain one or more dielectric materials that can be selectively removed without adversely affecting the materials of the instances of first dielectric material 402, the second dielectric material 408, the third dielectric material 410, the charge-storage structure 414, the gate dielectric structure 416, and the channel material structure 418. The dielectric 440 might be deposited overlying the structure of FIG. 5H, and then removed to the level of an upper surface of the upper instance of first dielectric material 402, e.g., instance of first dielectric material 4024 such as by chemical-mechanical planarization (CMP). A portion of the via 406 might remain after forming the dielectric 440.

Figure 5J:
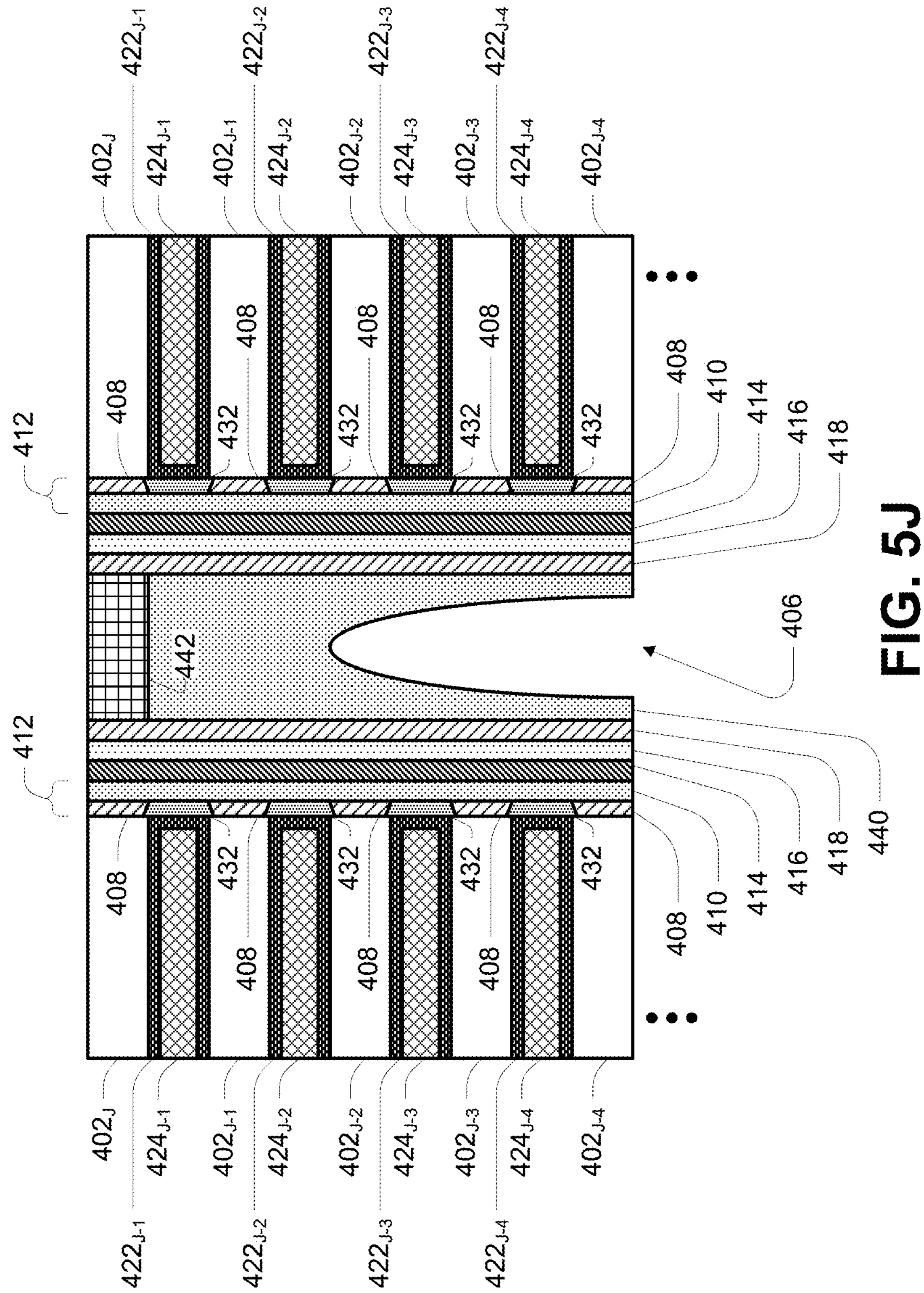

In FIG. 5J, a portion of the dielectric 440 might be removed to recess the upper surface of the dielectric 440. For example, the dielectric 440 might be recessed to expose portions of the channel material structure 418 to a level near the upper instance of control gate 424, e.g., control gate 424$_{J-1}$. A conductive plug 442 might be formed overlying the dielectric 440 and in contact with, and connected to, the channel material structure 418. The conductive plug 442 might contain one or more conductive materials, e.g., conductive materials such as described with reference to the conductors 424. For some embodiments, the conductive plug 442 might contain an $n^+$-type conductively-doped polysilicon.

A transistor might be formed at each intersection of a control gate 424 and the channel material structure 418. The channel material structure 418 adjacent to the control gate 424 might function as a channel of the transistor, and an instance of high-K dielectric material 422 and/or charge-blocking structure 412, charge-storage structure 414, and gate dielectric structure 416 between the control gate 424 and the adjacent portion of the channel material structure 418 might function as a charge-blocking node, charge-storage node and gate dielectric, respectively, of that transistor. Such transistors could include memory cells 208, select gates 210, select gates 212, etc.

Figure 5K:
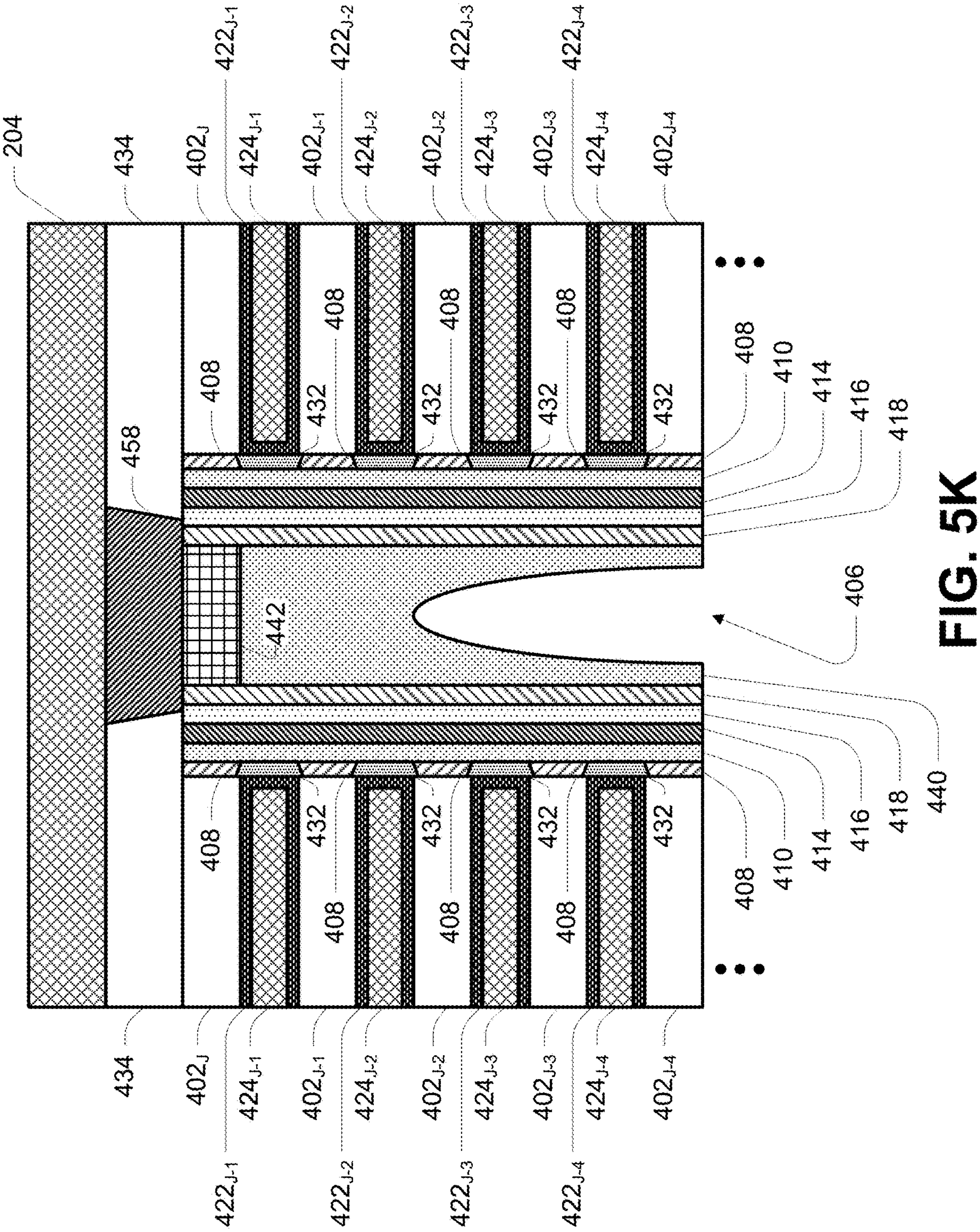

In FIG. 5K, a data line contact 458 might be formed through a dielectric 434 that might be formed overlying the structure of FIG. 5J. The data line contact 458 might be formed to be in contact with the conductive plug 442. A data line 204 might be formed overlying the data line contact 458. The data line 204 might be connected to the channel material structure 418, e.g., through the contact 458 and conductive plug 442. The contact 458 might contain one or more conductive materials, e.g., conductive materials such as described with reference to the conductors 424. For some embodiments, the contact 458 might contain an $n^+$-type conductively-doped polysilicon. For other embodiments, the contact 458 might include an $n^+$-type conductively-doped polysilicon formed overlying the conductive plug 442, titanium nitride (TiN) formed overlying the $n^+$-type conductively-doped polysilicon, and tungsten (W) formed overlying the titanium nitride. For further embodiments, the upper portion of the channel material structure 418 might be doped to an $n^+$-type conductivity, and the contact 458 might include titanium nitride (TiN) formed overlying the channel material structure 444$_0$, and tungsten (W) formed overlying the titanium nitride.

While FIGS. 5A-5K depicted an example method of fabricating a portion of the memory array structure of FIG. 4, other methods of fabrication could be used with various embodiments. For example, instead of subjecting the structure of FIG. 5D to radical oxidation, the exposed portions of the second dielectric material 408 might be removed, e.g., by wet etching, to expose portions of the third dielectric material 410. New material could be grown from, or otherwise deposited on, the exposed portions of the third dielectric material 410, thereby forming the fourth dielectric material 432. Processing could then proceed as described with reference to FIGS. 5F-5K.

Figure 6:
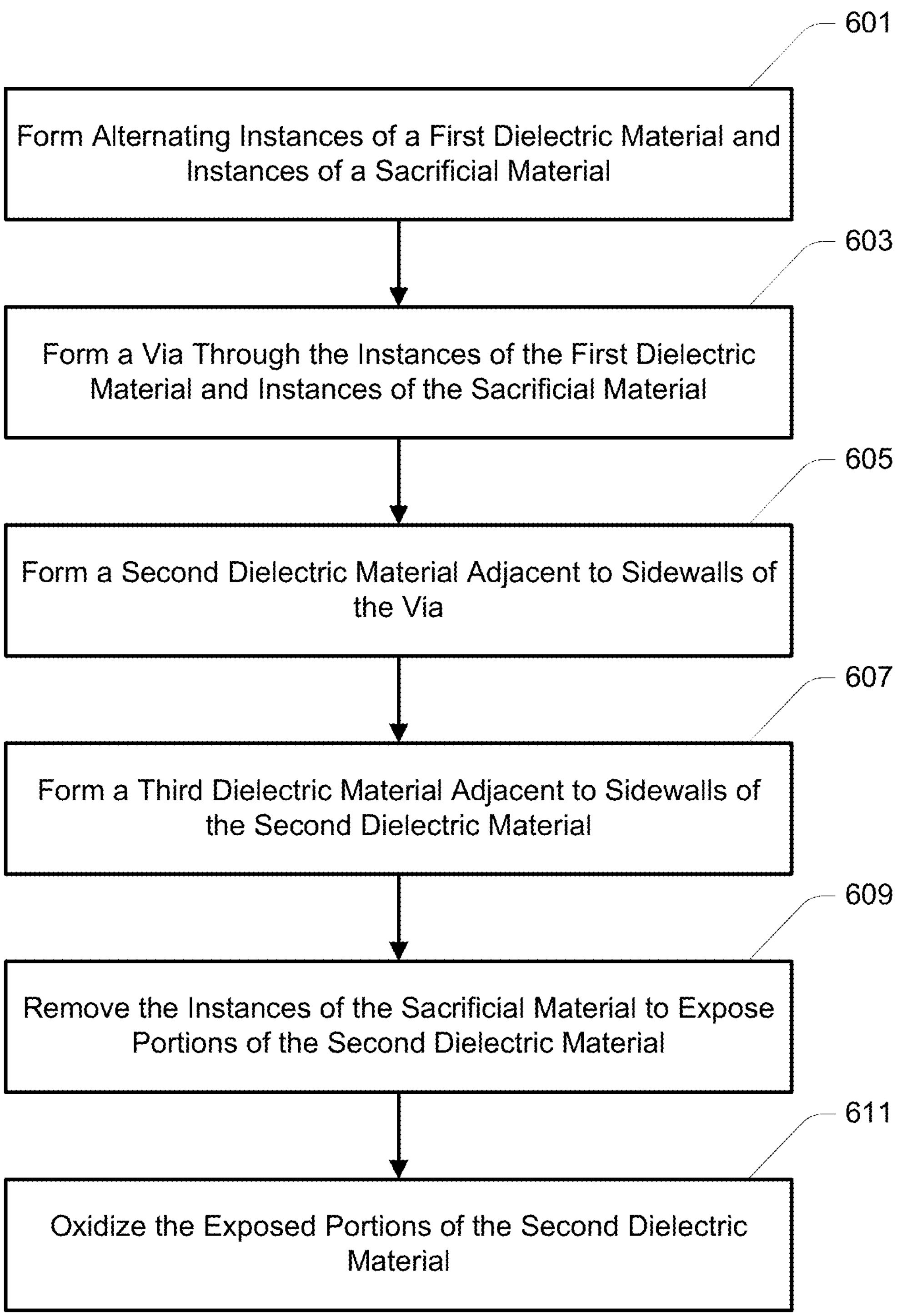
FIG. 6 is a flowchart of a method of forming a memory array structure in accordance with an embodiment.

FIG. 6 is a flowchart of a method of forming a memory array structure in accordance with an embodiment. At 601, alternating instances of a first dielectric material and instances of a sacrificial material might be formed. For example, alternating instances of the first dielectric material 402 and instances of the sacrificial material 404 might be formed. At 603, a via might be formed through the instances of the first dielectric material and the instances of the sacrificial material. For example, the via 406 might be formed through the instances of the first dielectric material 402 and the instances of the sacrificial material 404. At 605, a second dielectric material might be formed adjacent sidewalls of the via. For example, the second dielectric material 408 might be formed adjacent (e.g., overlying or on) the sidewalls of the via 406, which might correspond to sidewalls of the instances of the first dielectric material 402 and the instances of the sacrificial material 404. At 607, a third dielectric material might be formed adjacent to sidewalls of the second dielectric material. For example, the third dielectric material 410 might be formed adjacent to (e.g., overlying or on) the sidewalls of the second dielectric material 408. At 609, the instances of the sacrificial material might be removed to expose portions of the second dielectric material. For example, the instances of the sacrificial material 404 might be removed to expose portions of the second dielectric material 408. At 611, the exposed portions of the second dielectric material might be oxidized. For example, the exposed portions of the second dielectric material 408 might be oxidized to form instances of the fourth dielectric material 432 having intervening instances of the second dielectric material 408 between memory cells 208.

Figure 7A:
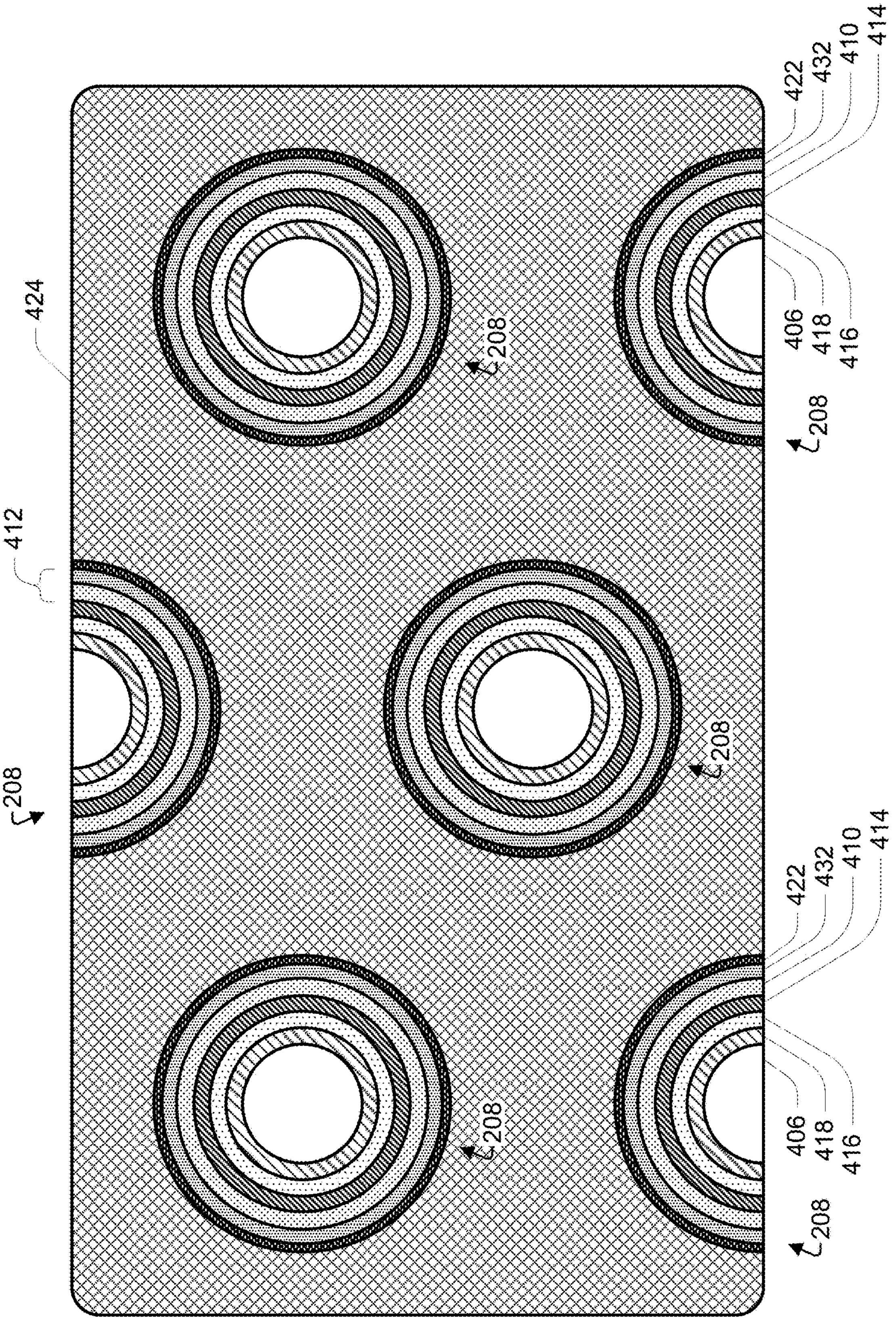
FIGS. 7A-7B depict top views of different levels of a memory array structure in accordance with an embodiment.
Figure 7B:
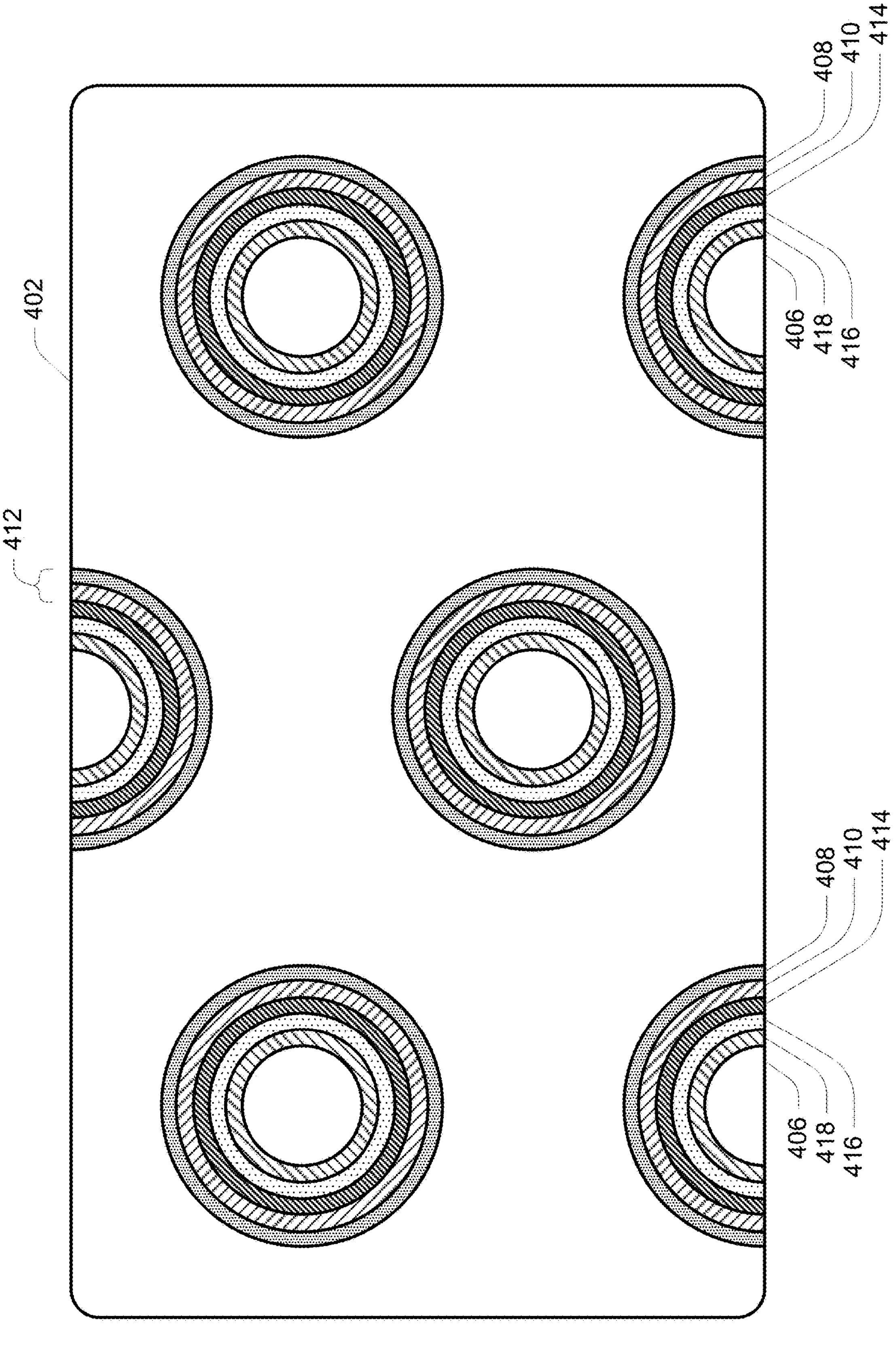

FIGS. 7A-7B depict top views of different levels of a memory array structure in accordance with an embodiment. The view of FIG. 7A might be taken at a level of a control gate 424 of the memory array structure. For example, the view of FIG. 7A might represent a plane parallel to, and extending through, a control gate 424 of FIG. 5H, e.g., extending left to right through a center of one of the control gates 424 of FIG. 5H. The view of FIG. 7B might be taken at a level of an instance of the first dielectric material 402 of the memory array structure. For example, the view of FIG. 7B might represent a plane parallel to, and extending through, an instance of the first dielectric material 402 of FIG. 5H, e.g., extending left to right through a center of one of the instances of the first dielectric material 402 of FIG. 5H. Like numbered elements in FIGS. 7A-7B correspond to the description as provided with respect to FIGS. 5A-5K.

As can be seen in a comparison of FIGS. 7A and 7B, a composition of a portion of the charge-blocking structure 412 adjacent a control gate 424, e.g., comprising the fourth dielectric material 432 and the third dielectric material 410, might be different that the composition of a portion of the charge-blocking structure 412 adjacent an instance of the first dielectric material 402, e.g., comprising the second dielectric material 408 and the third dielectric material 410.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. A memory array structure, comprising:

a first memory cell comprising a first control gate, a first portion of a charge-blocking structure adjacent to a sidewall of the first control gate, and a first portion of a charge-storage structure adjacent to the first portion of the charge-blocking structure;

a second memory cell comprising a second control gate, a second portion of the charge-blocking structure adjacent to a sidewall of the second control gate, and a second portion of the charge-storage structure adjacent to the second portion of the charge-blocking structure; and a first dielectric material between the first control gate and the second control gate, and comprising a sidewall adjacent to a third portion of the charge-blocking structure that is between the first portion of the charge-blocking structure and the second portion of the charge-blocking structure;

wherein the third portion of the charge-blocking structure comprises a second dielectric material and a third dielectric material different than the second dielectric material;

wherein the first portion of the charge-blocking structure and the second portion of the charge-blocking structure each comprise the third dielectric material and a fourth dielectric material different than the second dielectric material;

wherein the third dielectric material of the first portion of the charge-blocking structure is between the fourth dielectric material of the first portion of the charge-blocking structure and the first portion of the charge-storage structure;

wherein the third dielectric material of the second portion of the charge-blocking structure is between the fourth dielectric material of the second portion of the charge-blocking structure and the second portion of the charge-storage structure;

wherein the third dielectric material is a continuous dielectric material from the first portion of the charge-blocking structure to the second portion of the charge-blocking structure; and wherein the sidewall of the first dielectric material is vertically aligned with a sidewall of each of the first portion of the charge-blocking structure and the second portion of the charge-blocking structure.

2. The memory array structure of claim 1, wherein the third dielectric material and the fourth dielectric material are a same dielectric material.

3. The memory array structure of claim 1, wherein the fourth dielectric material has a different dielectric constant than the second dielectric material.

4. The memory array structure of claim 3, wherein the fourth dielectric material comprises an oxidation reaction product of the second dielectric material.

5. The memory array structure of claim 3, wherein the second dielectric material comprises a silicon-containing dielectric material, and wherein the fourth dielectric material comprises silicon dioxide.

6. The memory array structure of claim 1, wherein the third portion of the charge-blocking structure consists essentially of the second dielectric material and the third dielectric material, and wherein the first portion of the charge-blocking structure and the second portion of the charge-blocking structure each consist essentially of the third dielectric material and the fourth dielectric material.

7. A memory array structure, comprising:

a first memory cell comprising a first control gate and a first portion of a charge-blocking structure adjacent to a sidewall of the first control gate;

a second memory cell comprising a second control gate and a second portion of the charge-blocking structure adjacent to a sidewall of the second control gate; and a first dielectric material between the first control gate and the second control gate, and comprising a sidewall adjacent to a third portion of the charge-blocking structure that is between the first portion of the charge-blocking structure and the second portion of the charge-blocking structure;

wherein the third portion of the charge-blocking structure comprises a second dielectric material and a third dielectric material different than the second dielectric material;

wherein the first portion of the charge-blocking structure and the second portion of the charge-blocking structure each comprise the third dielectric material and a fourth dielectric material different than the second dielectric material; and wherein the second dielectric material of the third portion of the charge-blocking structure is immediately adjacent to the sidewall of the first dielectric material; and wherein the sidewall of the first dielectric material is vertically aligned with a sidewall of each of the first portion of the charge-blocking structure and the second portion of the charge-blocking structure.

8. The memory array structure of claim 7, wherein the second dielectric material of the third portion of the charge-blocking structure is immediately adjacent to the third dielectric material of the third portion of the charge-blocking structure, wherein the fourth dielectric material of the first portion of the charge-blocking structure is immediately adjacent to the third dielectric material of the first portion of the charge-blocking structure, and wherein the fourth dielectric material of the second portion of the charge-blocking structure is immediately adjacent to the third dielectric material of the second portion of the charge-blocking structure.

9. The memory array structure of claim 8, wherein a fifth dielectric material of the first memory cell is between the sidewall of the first control gate and the fourth dielectric material of the first portion of the charge-blocking structure.

10. The memory array structure of claim 9, wherein the fifth dielectric material of the first memory cell is further between the first control gate and the first dielectric material.

11. A memory array structure, comprising:

a first memory cell comprising a first control gate, a first portion of a charge-blocking structure adjacent to a sidewall of the first control gate, and a first portion of a charge-storage structure adjacent to the first portion of the charge-blocking structure, wherein the first control gate surrounds the first portion of the charge-blocking structure and surrounds the first portion of the charge-storage structure;

a second memory cell comprising a second control gate, a second portion of the charge-blocking structure adjacent to a sidewall of the second control gate, and a second portion of the charge-storage structure adjacent to the second portion of the charge-blocking structure, wherein the second control gate surrounds the second portion of the charge-blocking structure and surrounds the second portion of the charge-blocking storage structure; and a first dielectric material between the first control gate and the second control gate, and comprising a sidewall adjacent to a third portion of the charge-blocking structure that is between the first portion of the charge-blocking structure and the second portion of the charge-blocking structure, wherein the first dielectric material surrounds the third portion of the charge-blocking structure;

wherein the third portion of the charge-blocking structure comprises a second dielectric material and a third dielectric material different than the second dielectric material;

wherein the first portion of the charge-blocking structure and the second portion of the charge-blocking structure each comprise the third dielectric material and a fourth dielectric material different than the second dielectric material;

wherein the third dielectric material of the first portion of the charge-blocking structure is between the fourth dielectric material of the first portion of the charge-blocking structure and the first portion of the charge-storage structure;

wherein the third dielectric material of the second portion of the charge-blocking structure is between the fourth dielectric material of the second portion of the charge-blocking structure and the second portion of the charge-storage structure; and wherein the third dielectric material is a continuous dielectric material from the first portion of the charge-blocking structure to the second portion of the charge-blocking structure; and wherein the sidewall of the first dielectric material is vertically aligned with a sidewall of each of the first portion of the charge-blocking structure and the second portion of the charge-blocking structure.

12. The memory array structure of claim 11, wherein the fourth dielectric material comprises a reaction product of the second dielectric material.

13. The memory array structure of claim 11, wherein the third portion of the charge-blocking structure consists essentially of the second dielectric material and the third dielectric material, and wherein the first portion of the charge-blocking structure and the second portion of the charge-blocking structure each consist essentially of the third dielectric material and the fourth dielectric material.

14. A memory array structure, comprising:

a first memory cell comprising a first control gate and a first portion of a charge-blocking structure adjacent to a sidewall of the first control gate, wherein the first control gate surrounds the first portion of the charge-blocking structure;

a second memory cell comprising a second control gate and a second portion of the charge-blocking structure adjacent to a sidewall of the second control gate, wherein the second control gate surrounds the second portion of the charge-blocking structure; and a first dielectric material between the first control gate and the second control gate, and comprising a sidewall adjacent to a third portion of the charge-blocking structure that is between the first portion of the charge-blocking structure and the second portion of the charge-blocking structure, wherein the first dielectric material surrounds the third portion of the charge-blocking structure;

wherein the third portion of the charge-blocking structure comprises a second dielectric material and a third dielectric material different than the second dielectric material;

wherein the first portion of the charge-blocking structure and the second portion of the charge-blocking structure each comprise the third dielectric material and a fourth dielectric material different than the second dielectric material;

wherein the second dielectric material of the third portion of the charge-blocking structure is immediately adjacent to the sidewall of the first dielectric material; and wherein the sidewall of the first dielectric material is vertically aligned with a sidewall of each of the first portion of the charge-blocking structure and the second portion of the charge-blocking structure.

15. The memory array structure of claim 14, wherein the second dielectric material of the third portion of the charge-blocking structure is immediately adjacent to the third dielectric material of the third portion of the charge-blocking structure, wherein the fourth dielectric material of the first portion of the charge-blocking structure is immediately adjacent to the third dielectric material of the first portion of the charge-blocking structure, wherein the fourth dielectric material of the second portion of the charge-blocking structure is immediately adjacent to the third dielectric material of the second portion of the charge-blocking structure, wherein the fourth dielectric material of the first portion of the charge-blocking structure is immediately adjacent to the second dielectric material of the third portion of the charge-blocking structure, and wherein the fourth dielectric material of the second portion of the charge-blocking structure is immediately adjacent to the second dielectric material of the third portion of the charge-blocking structure opposite the fourth dielectric material of the first portion of the charge-blocking structure.

16. The memory array structure of claim 15, wherein a fifth dielectric material of the first memory cell is between the sidewall of the first control gate and the fourth dielectric material of the first portion of the charge-blocking structure, and wherein a fifth dielectric material of the second memory cell is between the sidewall of the second control gate and the fourth dielectric material of the second portion of the charge-blocking structure.

17. The memory array structure of claim 16, wherein the fifth dielectric material of the first memory cell is further between the first control gate and the first dielectric material, and wherein the fifth dielectric material of the second memory cell is further between the second control gate and the first dielectric material.

18. A memory array structure, comprising:

a first memory cell comprising a first control gate, a first portion of a charge-blocking structure adjacent to a sidewall of the first control gate, and a first portion of a charge-storage structure adjacent to the first portion of the charge-blocking structure;

a second memory cell comprising a second control gate, a second portion of the charge-blocking structure adjacent to a sidewall of the second control gate, and a second portion of the charge-storage structure adjacent to the second portion of the charge-blocking structure; and a first dielectric material between the first control gate and the second control gate, and comprising a sidewall adjacent to a third portion of the charge-blocking structure that is between the first portion of the charge-blocking structure and the second portion of the charge-blocking structure;

wherein the third portion of the charge-blocking structure comprises a second dielectric material and a third dielectric material different than the second dielectric material;

wherein the first portion of the charge-blocking structure and the second portion of the charge-blocking structure each comprise the third dielectric material and a fourth dielectric material different than the second dielectric material;

wherein the fourth dielectric material is an oxidation reaction product of the second dielectric material and is a same dielectric material as the third dielectric material;

wherein the charge-storage structure is a continuous structure from the first portion of the charge-storage structure to the second portion of the charge-storage structure; and wherein the sidewall of the first dielectric material is vertically aligned with a sidewall of each of the first portion of the charge-blocking structure and the second portion of the charge-blocking structure.

19. The memory array structure of claim 18, wherein the third dielectric material and the fourth dielectric material each comprise silicon dioxide.

20. The memory array structure of claim 18, further comprising a fifth dielectric material between the first control gate and the first portion of the charge-blocking structure, between the second control gate and the second portion of the charge-blocking structure, between the first control gate and the first dielectric material, and between the second control gate and the first dielectric material.

* * * * *